(12) United States Patent
Mitsukura et al.

(10) Patent No.: US 12,405,198 B2
(45) Date of Patent: Sep. 2, 2025

(54) PHOTOSENSITIVE RESIN COMPOSITION, METHOD FOR SELECTING PHOTOSENSITIVE RESIN COMPOSITION, METHOD FOR PRODUCING PATTERNED CURED FILM, AND METHOD FOR PRODUCING SEMICONDUCTOR DEVICE

(71) Applicant: Showa Denko Materials Co., Ltd., Tokyo (JP)

(72) Inventors: Kazuyuki Mitsukura, Tokyo (JP); Yuki Imazu, Tokyo (JP); Yu Aoki, Tokyo (JP); Takuya Komine, Tokyo (JP)

(73) Assignee: Resonac Corporation, Tokyo (JP)

( * ) Notice: Subject to any disclaimer, the term of this patent is extended or adjusted under 35 U.S.C. 154(b) by 581 days.

(21) Appl. No.: 17/801,378

(22) PCT Filed: Oct. 26, 2020

(86) PCT No.: PCT/JP2020/040109
§ 371 (c)(1),
(2) Date: Aug. 22, 2022

(87) PCT Pub. No.: WO2021/171697
PCT Pub. Date: Sep. 2, 2021

(65) Prior Publication Data
US 2023/0104391 A1    Apr. 6, 2023

(30) Foreign Application Priority Data

Feb. 26, 2020 (JP) .................................. 2020-030134
Feb. 26, 2020 (JP) .................................. 2020-030486

(51) Int. Cl.
G01N 3/32    (2006.01)
G03F 7/22    (2006.01)
(Continued)

(52) U.S. Cl.
CPC .................. *G01N 3/32* (2013.01); *G03F 7/22* (2013.01); *G03F 7/40* (2013.01);
(Continued)

(58) Field of Classification Search
CPC ............ G01N 3/32; G01N 2203/0005; G01N 2203/0017; G01N 2203/0067;
(Continued)

(56) References Cited

FOREIGN PATENT DOCUMENTS

| JP | 2007-057595 A | 3/2007 |
|---|---|---|
| JP | 2008-076583 A | 4/2008 |

(Continued)

OTHER PUBLICATIONS

Hiroshi Matsutani, Takashi Hattori, Masayuki Ohe, Takumi Ueno, Robert L. Hubbard, and Zak Fathi, "Low Temperature Curing of Polyimide Precursors by Variable Frequency Microwave", Journal of Photopolymer Science and Technology, 2005, p. 327-p. 332 (cited in specification).

*Primary Examiner* — Caleen O Sullivan
(74) *Attorney, Agent, or Firm* — FITCH, EVEN, TABIN & FLANNERY LLP

(57) ABSTRACT method for selecting a photosensitive resin composition exposing a resin film of a photosensitive resin composition at 100 to 2000 mJ/cm2 and heat-treating the resin film at 150° C. to 5 250° C. for 1 to 3 hours under nitrogen to produce a strip sample of a cured film having a film thickness of 10 μm and a width of 10 mm; performing a fatigue test of repeatedly pulling the strip sample under specific conditions; and selecting a photosensitive resin composition satisfying the following condition: the number of times of pulling required until the 15 strip sample breaks in the fatigue test is 100 or more cycles.

14 Claims, 7 Drawing Sheets

(51) Int. Cl.
*G03F 7/40* (2006.01)
*H01L 23/00* (2006.01)

(52) U.S. Cl.
CPC ............... *G01N 2203/0005* (2013.01); *G01N 2203/0017* (2013.01); *G01N 2203/0067* (2013.01); *G01N 2203/0073* (2013.01); *G01N 2203/0222* (2013.01); *H01L 24/05* (2013.01); *H01L 24/13* (2013.01); *H01L 2224/0401* (2013.01); *H01L 2224/13144* (2013.01)

(58) Field of Classification Search
CPC ... G01N 2203/0073; G01N 2203/0222; G01N 3/08; G01N 2203/0298; G03F 7/22; G03F 7/40; G03F 7/0233; G03F 7/0236; G03F 7/0757; G03F 7/16; G03F 7/20; G03F 7/38; H01L 24/05; H01L 24/13; H01L 2224/0401; H01L 2224/13144; H01L 21/76802
USPC .................................................. 430/30, 311
See application file for complete search history.

(56) References Cited

FOREIGN PATENT DOCUMENTS

| | | |
|---|---|---|
| JP | 2008-309885 A | 12/2008 |
| JP | 2018-095721 A | 6/2018 |
| JP | 2018-185480 A1 | 11/2018 |
| JP | 2018-203959 A | 12/2018 |
| WO | 2010/073948 A1 | 7/2010 |

PHOTOSENSITIVE RESIN COMPOSITION, METHOD FOR SELECTING PHOTOSENSITIVE RESIN COMPOSITION, METHOD FOR PRODUCING PATTERNED CURED FILM, AND METHOD FOR PRODUCING SEMICONDUCTOR DEVICE

TECHNICAL FIELD

The present invention relates to a photosensitive resin composition, a method for selecting a photosensitive resin composition, a method for producing a patterned cured film, and a method for producing a semiconductor device.

BACKGROUND ART

In order to realize high-speed transmission and miniaturization of semiconductor devices, semiconductor packages in which materials having different physical properties are combined in a complicated manner to be highly densified, have been proposed. In such a semiconductor package, since the stress on semiconductor elements and rewiring layers becomes large, a material that relieves stress and also has high mechanical reliability is required.

In order to reduce the stress on a Low-k material that is formed on a semiconductor element, a surface protective film that can relieve stress is needed, and in a fan-out type package, an interlayer insulating film that can withstand higher stress than conventional ones is needed. Furthermore, due to low heat resistance of semiconductor elements, and in order to reduce the stress of semiconductor packages, the materials used for a surface protective film and an interlayer insulating film are required to be thermally cured at a temperature of 250° C. or lower.

In response to such a demand, it has been suggested to use a patterned cured film formed from a photosensitive resin composition including a polyimide resin, a polybenzoxazole resin, or a phenol resin, all of which can be cured at low temperatures, as a surface protective film or an interlayer insulating film (see, for example, Patent Literatures 1 to 5).

CITATION LIST

Patent Literature

Patent Literature 1: JP 2008-309885 A
Patent Literature 2: JP 2007-57595 A
Patent Literature 3: JP 2008-076583 A
Patent Literature 4: WO 2010/073948 A1
Patent Literature 5: JP 2018-185480 A

SUMMARY OF INVENTION

Technical Problem

For a photosensitive resin composition for forming a surface protective film or an interlayer insulating film, a material having high reliability even when cured at a temperature of 250° C. or lower is required in order to reduce stress, warpage, and damage to semiconductor elements, and in addition, due to environmental load, safety, and restrictions on device surface, there is a strong demand for a photosensitive material that can be developed with an alkali aqueous solution. However, these materials are less likely to satisfy sufficient mechanical reliability in package forms with high stress, and cracks may be generated in the protective film or insulating film.

It is an object of the present disclosure to provide a simple method for selecting a photosensitive resin composition forming a cured film that can be developed with an alkali aqueous solution, does not generate cracks or the like even when cured at 250° C. or lower, and has high mechanical and thermal shock reliability, a photosensitive resin composition selected by this selection method, a method for producing a patterned cured film using a photosensitive resin composition selected by this selection method, and a method for producing a semiconductor device.

Solution to Problem

An aspect of the present disclosure relates to a method for selecting a photosensitive resin composition, the method including: exposing a resin film of a photosensitive resin composition at 100 to 2000 mJ/cm$^2$ and heat-treating the resin film at 150° C. to 250° C. for 1 to 3 hours under nitrogen to produce a strip sample of a cured film having a film thickness of 10 μm and a width of 10 mm; performing a fatigue test of repeatedly pulling the strip sample under the conditions including a set temperature of 25° C., a distance between chucks of 20 mm, a testing rate of 5 mm/min, and a cyclic load stress of 100 MPa; and selecting a photosensitive resin composition satisfying the following condition: a number of times of pulling required until the strip sample breaks in the fatigue test is 100 or more cycles.

The above-described fatigue test for the strip sample may also be carried out under the conditions including a set temperature of −55° C., a distance between chucks of 20 mm, a testing rate of 5 mm/min, and a cyclic load stress of 120 MPa.

Another aspect of the present disclosure relates to a photosensitive resin composition satisfying the following condition: when a resin film of a photosensitive resin composition is exposed at 100 to 2000 mJ/cm$^2$ and heat-treated at 150° C. to 250° C. for 1 to 3 hours under nitrogen to produce a strip sample of a cured film having a film thickness of 10 μm and a width of 10 mm, and a fatigue test of repeatedly pulling the strip sample is performed under the conditions including a set temperature of 25° C., a distance between chucks of 20 mm, a testing rate of 5 mm/min, and a cyclic load stress of 100 MPa, or under the conditions including a set temperature of −55° C., a distance between chucks of 20 mm, a testing rate of 5 mm/min, and a cyclic load stress of 120 MPa, a number of times of pulling required until the strip sample breaks is 100 or more cycles.

Another aspect of the present disclosure relates to a method for producing a patterned cured film, the method including a step of applying a photosensitive resin composition selected by the above-mentioned method for selecting a photosensitive resin composition on a portion or the entire surface of a substrate and drying the photosensitive resin composition to form a resin film; a step of exposing at least a portion of the resin film; a step of developing the resin film after exposure to form a patterned resin film; and a step of heating the patterned resin film.

Still another aspect of the present disclosure relates to a method for producing a semiconductor device provided with a patterned cured film formed by the above-described method for producing a patterned cured film, as an interlayer insulating layer or a surface protective layer.

Advantageous Effects of Invention

According to the present disclosure, a simple method for selecting a photosensitive resin composition forming a cured film that can be developed with an alkali aqueous solution, does not generate cracks or the like even when cured at 250° C. or lower, and has high mechanical and thermal shock reliability, can be provided.

The present disclosure provides a method for selecting a photosensitive resin composition that does not generate cracks due to thermal shock in a temperature cycle test or the like in a case where the photosensitive resin composition is used for a surface protective film or an interlayer insulating film, and a material is selected by a fatigue test at 25° C. or −55° C., which is a low temperature that is previously not seen. The fatigue fracture resistance at 25° C. and −55° C. correlates with thermal shock reliability (package reliability), and the evaluation of thermal shock reliability (package reliability), which requires time for sample production and evaluation, can be carried out conveniently in a short time period by a fatigue test that can achieve evaluation conveniently and immediately. When a patterned cured film is produced by using the selected photosensitive resin composition, a semiconductor device having excellent thermal shock reliability, which will not generate cracks or the like by a temperature cycle test, can be produced.

DESCRIPTION OF EMBODIMENTS

Figure 1:
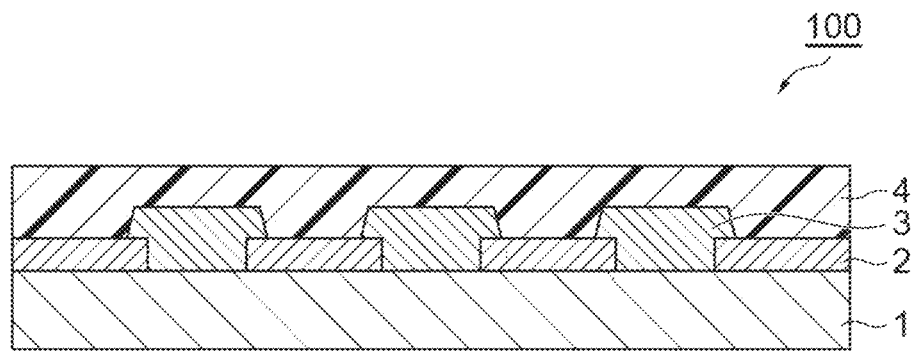
FIG. 1 is a schematic cross-sectional view explaining an embodiment of a production process for a semiconductor device.

Hereinafter, embodiments for carrying out the present disclosure will be described in detail. However, the present invention is not intended to be limited to the following embodiments. The term "step" as used in the present specification is not limited only to an independent step, and even when a step cannot be clearly distinguished from another step, as long as an expected action of the step is achieved, the step is included in the present term. The term "layer" as used in the present specification includes a structure having a shape that is formed over the entire surface as well as a structure having a shape that is formed on a portion, when viewed in a plan view.

A numerical value range indicated by using the term "to" in the present specification represents a range including the numerical values described before and after the term "to" as the minimum value and the maximum value, respectively. With regard to a numerical value range described stepwise in the present specification, the upper limit value or lower limit value of the numerical value range of a certain stage may be replaced with the upper limit value or the lower limit value of the numerical value range of another stage. Furthermore, with regard to a numerical value range described in the present specification, the upper limit value or the lower limit value of the numerical value range may be replaced with a value shown in the Examples.

When the amount of each component in the composition is mentioned in the present specification, in a case where there is a plurality of substances corresponding to each component in the composition, unless particularly stated otherwise, the amount means the total amount of the plurality of substances present in the composition. The term "(meth)acrylic acid" as used in the present specification means at least one of "acrylic acid" and "methacrylic acid" corresponding thereto. The same also applies to other similar expressions such as (meth)acrylate.

[Method for Selecting Photosensitive Resin Composition]

In an exemplary embodiment of the method for selecting a photosensitive resin composition according to the present embodiment, a resin film of a photosensitive resin composition is exposed at 100 to 2000 mJ/cm$^2$ and heat-treated at 150° C. to 250° C. for 1 to 3 hours under nitrogen to produce a strip sample of a cured film having a film thickness of 10 μm and a width of 10 mm, a fatigue test of repeatedly pulling the strip sample under the conditions including a set temperature of 25° C., a distance between chucks of 20 mm, a testing rate of 5 mm/min, and a cyclic load stress of 100 MPa, and a photosensitive resin composition satisfying the following condition: the number of times of pulling required until the strip sample breaks in the fatigue test is 100 or more cycles, is selected.

In another exemplary embodiment of the method for selecting a photosensitive resin composition according to the present embodiment, a resin film of a photosensitive resin composition is exposed at 100 to 2000 mJ/cm$^2$ and heat-treated at 150° C. to 250° C. for 1 to 3 hours under nitrogen to produce a strip sample of a cured film having a film thickness of 10 μm and a width of 10 mm, a fatigue test of repeatedly pulling the strip sample under the conditions including a set temperature of −55° C., a distance between chucks of 20 mm, a testing rate of 5 mm/min, and a cyclic load stress of 120 MPa, and a photosensitive resin composition satisfying the following condition: the number of times of pulling required until the strip sample breaks in the fatigue test is 100 or more cycles, is selected.

Hereinafter, the procedure of the method for selecting a photosensitive resin composition according to the present embodiment will be described in detail. First, a photosensitive resin composition is applied on a base material and dried to form a resin film. The type of the base material is not particularly limited, and for example, a silicon wafer having copper formed on the surface can be used. The photosensitive resin composition may be applied on the copper surface of the silicon wafer by using a spin coater. When the resin film is exposed and developed, a resin pattern is formed on copper. The exposure conditions for the resin film may be 500 to 1500 mJ/cm$^2$ or 800 to 1200 mJ/cm$^2$. A resin pattern is obtained by developing the resin film after exposure by using a liquid developer such as an alkali aqueous solution. A cured film of the resin pattern can be formed by heating the resin pattern under nitrogen. The heating temperature for the resin pattern may be 160° C. to 230° C. or 180° C. to 220° C., and the heating time may be 1.5 to 2.5 hours or 1.8 to 2.2 hours. When the base material on which a cured film of the resin pattern is formed is immersed in an etching solution for copper, a strip sample (strip-shaped cured film) for fatigue test measurement is obtained.

In the method for selecting a photosensitive resin composition according to the present embodiment, a photosensitive resin composition satisfying the condition that a fatigue test of a strip sample is performed, and the number of times of pulling required until the strip sample breaks is 100 or more cycles, is selected. The fatigue test can be performed under any of the following conditions (1) or (2).

Condition (1): The strip sample is repeatedly pulled (0 to 100 MPa) under the conditions including a set temperature of 25° C., a distance between chucks of 20 mm, a testing rate of 5 mm/min, and a cyclic load stress of 100 MPa.

Condition (2): The strip sample is repeatedly pulled (0 to 120 MPa) under the conditions including a step temperature of −55° C., a distance between chucks of 20 mm, a testing rate of 5 mm/min, and a cyclic load stress of 120 MPa.

By selecting a photosensitive resin composition satisfying the condition that the number of times of pulling required until the strip sample breaks in the fatigue test is 100 or more cycles, a cured film having excellent heat shock reliability characteristics can be obtained, and the generation of cracks and the like in a temperature cycle test of a semiconductor package can be reduced. The number of times of pulling at which breakage of the strip samples occurs in the fatigue test is defined as "fatigue fracture resistance". It is preferable that the number of times of pulling at the time when the strip sample breaks is 250 or more cycles, more preferably 500 or more cycles, even more preferably 800 or more cycles, and particularly preferably 1000 or more cycles.

According to the photosensitive resin composition selected by the method for selecting a photosensitive resin composition according to the present embodiment, even in a package having a large difference in the coefficient of linear expansion between copper and the resin, a large stress derived from an organic material such as an encapsulant, and a large warpage, cracks in the resin layer can be suppressed, and a semiconductor device having excellent reliability against thermal shock caused by a temperature cycle even in a package form having high stress, can be produced.

It is preferable that in a tensile test of pulling a strip sample that has been subjected to 100 cycles of the fatigue test, under the conditions including a set temperature of 25° C., a distance between chucks of 20 mm, and a testing rate of 5 mm/min, a breaking elongation ratio of the strip sample is 10% to 60%. When the elongation ratio of the cured film is 10% or greater, stress relaxation is easily achieved, and stress is concentrated on a semiconductor element or another organic member so that the reliability of the semiconductor package tends to be enhanced. When the elongation ratio of the cured film is 60% or less, the cured film tends to be less likely to be vulnerable during a temperature cycle. The elongation ratio of the cured film is more preferably 15% or greater from the viewpoint that stress can be further relieved, and even more preferably 20% or greater from the viewpoint that crack resistance is enhanced.

The elongation ratio is obtained by pulling a sample that has been subjected to 100 cycles of the fatigue test under the condition (1) or condition (2), by using an Autograph (AG-1kNXplus) with a special-type constant temperature tank manufactured by SHIMADZU CORPORATION under the conditions including a set temperature of −55° C., a distance between chucks of 20 mm, and a testing rate of 5 mm/min, and measuring the elongation ratio when the sample breaks.

It is preferable that the yield stress of the strip sample (cured film of a photosensitive resin composition) measured in the above-described tensile test is 120 to 200 MPa. When the yield stress is 120 MPa or greater, in a package with high stress, the cured film is less likely to undergo plastic deformation, and problems against repeated stress are less likely to occur. When the yield stress of the cured film is 200 MPa or less, the impact resistance tends to be enhanced. The yield stress of the cured film is more preferably 125 MPa or greater, and even more preferably 140 MPa or greater, from the viewpoint of maintaining the crack resistance after thermal history.

The yield stress is obtained such that a curve is obtained by plotting the elongation ratio on the axis of abscissa and stress on the axis of ordinate in the above-described tensile test, and the value of stress at the intersection of a tangent line of the obtained curve in the plot showing an elongation ratio of 5% and a tangent line of the curve in the plot showing an elongation ratio of 15% is defined as the yield stress.

In the above-described tensile test, measurement is made under three different stress conditions in which the number of times of repeated pulling is 2 to 1000, the number of times of repeated pulling at breakage is plotted on the axis of abscissa while the measured stress condition is plotted on the axis of ordinate, and the stress value at the time of 1000 cycles on an approximate straight line obtained from the three points can be determined as the critical stress of the cured film of the photosensitive resin composition. The critical stress of the cured film is preferably 120 MPa or greater, and from the viewpoint that crack resistance after thermal history can be maintained, the critical stress is more preferably 125 MPa or greater.

It is preferable that the Young's modulus of the strip sample measured in the above-described tensile test is 0.5 to 2.8 GPa. When the Young's modulus of the cured film is 0.5 GPa or greater, the cured film is less likely to be deformed when stress is applied, and it is easy to suppress stress from being concentrated on a material mounted on a semiconductor package and having a high Young's modulus. When the Young's modulus of the cured film is 2.8 GPa or less, stress in the cured film is relieved, and the semiconductor element is less likely to be damaged. The Young's modulus of the cured film is more preferably 1.0 to 2.7 GPa, and even more preferably 1.4 to 2.6 GPa.

The Young's modulus can be calculated from the gradient in an elongation range of 0% to 5% of a curve obtained by plotting the elongation ratio on the axis of abscissa and stress on the axis of ordinate in the above-described tensile test.

The glass transition temperature (Tg) of the cured film of the photosensitive resin composition according to the present embodiment is preferably 150° C. or higher, more preferably 170° C. or higher, and even more preferably 180° C. or higher. When the Tg of the cured film is 150° C. or higher, the stress at the time of temperature change in the temperature cycle test or the like can be reduced. The upper limit value of the Tg of the cured film may be 300° C. or lower.

Regarding the Tg, the viscoelasticity of the strip sample is measured by using a dynamic viscoelasticity measuring apparatus manufactured by UBM at a distance between chucks of 20 mm, a frequency of 10 Hz, and a temperature increase rate of 5° C./min in a temperature range of 40° C.

to 260° C., and the temperature presenting the maximum value of tan δ can be obtained as the glass transition temperature.

It is preferable that the coefficient of linear expansion of the cured film of the photosensitive resin composition according to the present embodiment is 20 to 100 ppm/° C. ($20\times10^{-6}$ to $100\times10^{-6}$/° C.). When the coefficient of linear expansion of the cured film is 100 ppm/° C. or less, the stress at the time of temperature change can be suppressed. When the coefficient of linear expansion of the cured film is 20 ppm/° C. or greater, it is easy to suppress the generation of cracks.

It is preferable that the deposit ratio of the cured film of the photosensitive resin composition according to the present embodiment to a plated copper substrate is 75% or higher. When the deposit ratio is 75% or higher, the cured film is peeled off from an electroplated copper pattern as an undercoat when stress is applied, and stress tends to be concentrated on a material having a high deposit ratio on electroplated copper mounted on a semiconductor package. A higher deposit ratio is more preferred, and the deposit ratio is more preferably 90% or higher, even more preferably 95% or higher, and particularly preferably 100%.

The deposit ratio can be measured by the following procedure. First, a photosensitive resin composition is applied on an electroplated copper substrate using a spin coater such that the film thickness after curing is 10 μm, and the applied film is heated under the conditions of 200° C. and 2 hours under nitrogen to form a cured film. Next, the cured film is repeatedly subjected to 200 times of a temperature cycle test of changing temperature from −65° C. to 150° C. in an air atmosphere at atmospheric pressure under the conditions of a stopping time of 15 minutes, with the initiation temperature and the completion temperature set at −65° C., and then the cured film is cut in a lattice pattern by the cross-cut method specified in JIS K 5600-5-6. A tape peeling test is performed on the cured film cut in a lattice pattern, and the proportion (deposit ratio) of lattices (cured film) deposited on the electroplated copper substrate is calculated.

The photosensitive resin composition according to the embodiments is such that when the above-mentioned fatigue test is performed, the number of times of pulling required until the strip sample breaks is 100 or more cycles. The photosensitive resin composition may be a positive-type photosensitive resin composition or may be a negative-type photosensitive resin composition. The photosensitive resin composition can include, for example, (A) an alkali-soluble resin, (B) a thermosetting resin, and (C) a photosensitizer. Hereinafter, each component that the photosensitive resin composition may contain will be described in detail.

(Component (A): Alkali-Soluble Resin)

The photosensitive resin composition according to the present embodiment can include an alkali-soluble resin as component (A), from the viewpoint of enhancing alkali developability. According to the present specification, the alkali-soluble resin means a resin that is soluble in an alkali aqueous solution (liquid developer). Incidentally, the alkali aqueous solution is an alkaline solution such as an aqueous solution of tetramethylammonium hydroxide (TMAH), an aqueous solution of a metal hydroxide, or an aqueous solution of an organic amine Generally, an aqueous solution of TMAH having a concentration of 2.38% by mass is used for development. Whether the component (A) is soluble in an alkali liquid developer can be checked, for example, as follows.

A varnish obtained by dissolving a resin in any solvent is spin-coated on a substrate such as a silicon wafer to form a coating film having a film thickness of about 5 μm. This is immersed in any of an aqueous solution of TMAH, an aqueous solution of a metal hydroxide, or an aqueous solution of an organic amine, at 20° C. to 25° C. When the coating film can be uniformly dissolved as the result, the resin is considered to be soluble in an alkali liquid developer.

The component (A) is not particularly limited as long as it is dissolved in an aqueous solution of TMAH at a concentration of 2.38% by mass; however, the component (A) is preferably a compound having a phenolic hydroxyl group or a carboxyl group.

Examples of the compound having a phenolic hydroxyl group include a polyimide resin, a polybenzoxazole resin, a polyamide resin, a novolac resin that is a condensate of phenol-formaldehyde, a cresol and formaldehyde condensation novolac resin, a phenol-naphthol/formaldehyde condensation novolac resin, polyhydroxystyrene or a copolymer thereof, a phenol-xylylene glycol condensation resin, a cresol-xylylene glycol condensation resin, a phenol dicyclopentadiene condensation resin, and an acrylic polymer having a phenolic hydroxyl group.

The acrylic polymer having a phenolic hydroxyl group is not particularly limited; however, an acrylic polymer represented by the following General Formula (1) can be used. In Formula (1), $R_1$ represents a hydrogen atom or a methyl group.

[Chemical Formula 1]

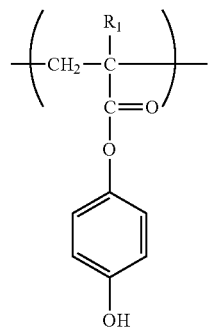

(1)

The phenolic hydroxyl group equivalent of the acrylic polymer having a phenolic hydroxyl group is preferably 200 to 700 g/eq, from the viewpoints of pattern formability and void reduction at the time of thermocompression bonding.

The acrylic polymer having a phenolic hydroxyl group may be a copolymer having a structural unit represented by Formula (1) together with a structural unit other than the structural unit represented by Formula (1) (hereinafter, simply referred to as "other structural unit"), and the other structural unit is a structural unit derived from a monomer copolymerizable with a monomer having the structural unit represented by Formula (1). The monomer having the other structural unit is not particularly limited; however, a (meth) acrylate compound or a vinyl compound can be used.

Examples of the monomer having the other structural unit include methyl acrylate, ethyl acrylate, propyl acrylate, butyl acrylate, octyl acrylate, methoxymethyl acrylate, methoxyethyl acrylate, ethoxyethyl acrylate, butoxyethyl acrylate, methoxyethoxyethyl acrylate, acrylic acid, methacrylic acid, hydroxyethyl acrylate, hydroxyethyl methacrylate, acrylonitrile, methacrylonitrile, ethacrylonitrile, dihydrodicyclopentenyl acrylate, dihydrodicyclopentenyl methacrylate, dihydrodicyclopentenyl itaconate, dihydrodicyclopentenyl maleate, dihydrodicyclopentenyl fumarate, dihydrodicyclopentenyloxyethyl acrylate, dihydrodicyclopentenyloxyethyl methacrylate, dihydrodicyclopentenyloxyethyl itaconate, dihydrodicyclopentenyloxyethyl maleate, dihydrodicylopetenyloxyethyl fumarate, vinyl methacrylate, vinyl acrylate, 1,1-dimethylpropenyl methacrylate, 1,1-dimethylpropenyl acrylate, 3,3-dimethylbutenyl methacrylate, 3,3-dimethylbutenyl acrylate, divinyl itaconate, divinyl maleate, divinyl fumarate, dicyclopentadiene, methyl dicyclopentadiene, ethylidene norbornene, 1,1-dimethylpropenyl methacrylate, 1,1-dimethylpropenyl acrylate, 3,3-dimethylbutenyl methacrylate, 3,3-dimethylbutenyl acrylate, vinyl 1,1-dimethylpropenyl ether, vinyl 3,3-dimethylbutenyl ether, 1-acryloyloxy-1-phenylethene, 1-acryloyloxy-2-phenylethene, 1-methacryloyloxy-1-phenylethene, and 1-methacryloyloxy-2-phenylethene.

The component (A) may include a compound having a carboxyl group. The compound having a carboxyl group is not particularly limited; however, an acrylic polymer having a carboxyl group in a side chain is preferably used.

As the component (A), a mixture of (A1) an alkali-soluble resin having a Tg of 150° C. or higher and (A2) an alkali-soluble resin having a Tg of 120° C. or lower may be used. By adopting such a configuration, a cured film having more excellent reliability is obtained.

When (A1) an alkali-soluble resin having a Tg of 150° C. or higher and (A2) an alkali-soluble resin having a Tg of 120° C. or lower are mixed, it is preferable to blend 5 to 30 parts by mass of (A2) with respect to 100 parts by mass of (A1). When the blending amount of (A2) is 5 parts by mass or more, there is a tendency that elongation of the cured film is impaired so that fatigue fracture resistance is decreased, and when the blending amount is 30 parts by mass or less, there is a tendency that strength of the cured film is impaired so that fatigue fracture resistance is decreased.

The Tg of the component (A) is the peak temperature of tan δ when measurement is made for a film formed from the component (A) by using a viscoelasticity analyzer (trade name "RSA-2", manufactured by Rheometric Scientific, Inc.) under the conditions including a temperature increase rate of 5° C./min, a frequency of 1 Hz, and a measurement temperature of −150° C. to 300° C.

It is preferable that the weight average molecular weight (Mw) of the component (A) is controlled to be in the range of 2000 to 200000, and the weight average molecular weight is more preferably 3000 to 100000, and even more preferably 5000 to 80000. Particularly, the Mw of the alkali-soluble resin of (A1) is preferably 2000 to 50000, and from the viewpoint of reliability, the Mw is more preferably 4000 to 30000, while from the viewpoint of resolution at the time of pattern formation, the Mw is even more preferably 2000 to 30000. Furthermore, the Mw of the alkali-soluble resin of (A2) is preferably 10000 to 100000, and from the viewpoint of reliability, the Mw is more preferably 15000 to 100000, while from the viewpoint of resolution at the time of pattern formation, the Mw is even more preferably 15000 to 70000.

According to the present specification, Mw is a value obtained by making measurement by a gel permeation chromatography (GPC) method and performing conversion from a standard polystyrene calibration curve. As the measuring apparatus, for example, high-performance liquid chromatography (trade name "C-R4A", manufactured by SHIMADZU CORPORATION) can be used.

From the viewpoint of further enhancing the fatigue fracture resistance, the component (A) may include an alkali-soluble resin having an imide group. Regarding the alkali-soluble resin having an imide group, from the viewpoint that the concentration of imide groups can be arbitrarily adjusted, an acrylic polymer obtained by polymerizing a (meth)acrylate compound having an imide group is preferably used. As the alkali-soluble resin having an imide group, an alkali-soluble polyimide can also be used. From the viewpoint of resolution, it is preferable to use the alkali-soluble resin having an imide group in combination with a novolac resin or a phenol resin.

The alkali-soluble resin having an imide group may also be a copolymer of a (meth)acrylate compound having an imide group and a (meth)acrylate compound having a phenolic hydroxyl group or a carboxyl group. Examples of the (meth)acrylate compound having an imide group include N-acryloyloxyethylhexahydrophthalimide and N-methacryloyloxyethylhexahydrophthalimide. The proportion of a structural unit based on a (meth)acrylate compound having an imide group is, on the basis of all the monomer units constituting the alkali-soluble resin having an imide group, preferably 10% by mass or more from the viewpoint that toughness of the cured film can be enhanced, more preferably 20% by mass or more from the viewpoint that sufficient fatigue fracture resistance can be imparted, and preferably 60% by mass or less from the viewpoint that alkali-solubility is not impaired.

The content of the alkali-soluble resin having an imide group is, on the basis of the total amount of the component (A), preferably 10% by mass or more from the viewpoint that toughness of the cured film can be enhanced, more preferably 20% by mass or more from the viewpoint that deterioration can be suppressed during a thermal history, and even more preferably 30% by mass or more from the viewpoint that sufficient fatigue fracture resistance can be imparted.

The component (A) may include an alkali-soluble resin having an imide group and an alkali-soluble resin having no imide group. As a result, both the fine processability during development of the photosensitive resin composition and the fatigue fracture resistance of the cured film can be achieved at a high level.

The content of the alkali-soluble resin having an imide group is, on the basis of the total amount of solid content included in the photosensitive resin composition, preferably 5% by mass or more from the viewpoint that strength of the cured film can be enhanced, more preferably 10% by mass or more from the viewpoint that fatigue fracture strength can be enhanced, even more preferably 20% by mass or more from the viewpoint that sufficient fatigue fracture strength can be maintained even after thermal deterioration of the cured film, still more preferably 30% by mass or more from the viewpoint that toughness of the cured film can be enhanced, and preferably 80% by mass or less from the viewpoint of maintaining fine processability during development of the photosensitive resin composition. It is particularly preferable that the content of the alkali-soluble resin having an imide group that is included in the photosensitive resin composition is 30% to 80% by mass.

(Component (B): Thermosetting Resin)

It is preferable that the photosensitive resin composition according to the present embodiment includes (B) a thermosetting resin. Examples of the (B) thermosetting resin include an acrylate resin, an epoxy resin, a cyanate ester resin, a maleimide resin, an allylnadiimide resin, a phenol resin, a urea resin, a melamine resin, an alkyd resin, an unsaturated polyester resin, a diallyl phthalate resin, a silicone resin, a resorcinol formaldehyde resin, a triallyl cyanurate resin, a polyisocyanate resin, a resin containing tris(2-hydroxyethyl) isocyanurate, a resin containing triallyl trimellitate, and a thermosetting resin synthesized from cyclopentadiene. From the viewpoints of resolution, insulation reliability, and adhesiveness to metal of the photosensitive resin composition, the thermosetting resin is more preferably a compound having any one selected from a methylol group, an alkoxyalkyl group, and a glycidyl group.

By blending a compound having a glycidyl group as the component (B) into the photosensitive resin composition, when a resin film after pattern formation is heated and cured, the compound having a glycidyl group reacts with the component (A) and forms a bridged structure. As a result, brittleness and melting of the cured film can be prevented. As the compound having a glycidyl group, conventionally known compounds can be used. Examples of the compound having a glycidyl group include a bisphenol A epoxy resin, a bisphenol F epoxy resin, a phenol novolac epoxy resin, a cresol novolac epoxy resin, an alicyclic epoxy resin, glycidylamine, a heterocyclic epoxy resin, and a polyalkylene glycol diglycidyl ether.

The amount in the case of blending a compound having a glycidyl group into the photosensitive resin composition is preferably 1 to 30 parts by mass, and more preferably 3 to 25 parts by mass, with respect to 100 parts by mass of the component (A), from the viewpoint of the solubility in an alkali aqueous solution and the physical properties of the cured film.

(Component (C): Photosensitizer)

It is preferable that the photosensitive resin composition according to the present embodiment includes (C) a photosensitizer. As the (C) photosensitizer, a photoradical polymerization initiator that produces a radical when irradiated with light, or a photo-acid generator that produces acid when irradiated with light, can be used.

Examples of the photoradical polymerization initiator include an alkylphenone-based photopolymerization initiator, an acylphosphine-based photopolymerization initiator, an intramolecular hydrogen abstraction type photopolymerization initiator, and a cation-based photopolymerization initiator. These photopolymerization initiators can be purchased as Omnirad 651, Omnirad 184, Omnirad 1173, Omnirad 2959, Omnirad 127, Omnirad 907, Omnirad 369, Omnirad 379 EG, Omnirad 819, Omnirad MBF, Omnirad TPO, and Omnirad 784 manufactured by IGM Resins B.V.; Irgacure OXE01, Irgacure OXE02, Irgacure OXE03, and Irgacure OXE04 manufactured by BASF; and the like. Regarding these photoradical polymerization initiators, one kind thereof may be used alone, or two or more kinds thereof may be used in combination, according to the purpose, use application, and the like.

A photoacid generator has a function of producing acid by irradiation with light and increasing the solubility of a portion that has been irradiated with light in an alkali aqueous solution. Examples of the photoacid generator include an o-quinone diazide compound, an aryldiazonium salt, a diaryliodonium salt, and a triarylsulfonium salt. Among these, from the viewpoint of having high sensitivity, an o-quinone diazide compound is preferred. As the o-quinone diazide compound, for example, a compound obtainable by subjecting o-quinone diazide sulfonyl chloride and a hydroxy compound, an amino compound, or the like to a condensation reaction in the presence of a dehydrochlorinating agent can be used. The reaction temperature may be 0° C. to 40° C., and the reaction time may be 1 to 10 hours.

Examples of the o-quinone diazide sulfonyl chloride include benzoquinone-1,2-diazide-4-sulfonyl chloride, naphthoquinone-1,2-diazide-5-sulfonyl chloride, and naphthoquinone-1,2-diazide-4-sulfonyl chloride.

Examples of the hydroxy compound include hydroquinone, resorcinol, pyrogallol, bisphenol A, bis(4-hydroxyphenyl)methane, 1,1-bis(4-hydroxyphenyl)-1-[4-{1-(4-hydroxyphenyl) methylethyl}phenyl]ethane, 2,2-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 4b,5,9b,10-tetrahydro-1,3,6,8-tetrahydroxy-5,10-dimethylindeno[2,1-a]indene, tris(4-hydroxyphenyl)methane, and tris(4-hydroxyphenyl)ethane.

Examples of the amino compound include p-phenylenediamine, m-phenylenediamine, 4,4'-diaminodiphenyl ether, 4,4'-diaminodiphenylmethane, 4,4'-diaminodiphenylsulfone, 4,4'-diaminodiphenyl sulfide, o-aminophenol, m-aminophenol, p-aminophenol, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, bis(3-amino-4-hydroxyphenyl)hexafluoropropane, and bis(4-amino-3-hydroxyphenyl)hexafluoropropane.

From the viewpoint of reactivity at the time of synthesizing an o-quinone diazide compound and from the viewpoint of having an appropriate absorption wavelength range when the resin film is exposed, it is preferable to use a compound obtained by a condensation reaction of 1,1-bis(4-hydroxyphenyl)-1-[4-{1-(4-hydroxyphenyl) methylethyl}phenyl]ethane and 1-naphthoquinone-2-diazide-5-sulfonyl chloride, or a compound obtained by a condensation reaction of tris(4-hydroxyphenyl)methane or tris(4-hydroxyphenyl)ethane and 1-naphthoquinone-2-diazide-5-sulfonyl chloride.

Examples of the dehydrochlorinating agent include sodium carbonate, sodium hydroxide, sodium hydrogen carbonate, potassium carbonate, potassium hydroxide, trimethylamine, triethylamine, and pyridine. Examples of the reaction solvent include dioxane, acetone, methyl ethyl ketone, tetrahydrofuran, diethyl ether, and N-methylpyrrolidone.

It is preferable that o-quinone diazide sulfonyl chloride and a hydroxy compound and/or an amino compound are blended such that the total number of moles of hydroxyl groups and amino groups is 0.5 to 1 mol with respect to 1 mol of o-quinone diazide sulfonyl chloride. A preferred blending proportion of the dehydrochlorinating agent and o-quinone diazide sulfonyl chloride is in the range of 0.95/1 to 1/0.95 molar equivalents.

From the viewpoints of the difference in the dissolution rate between an exposed part and an unexposed part and the allowable range of sensitivity, the content of the component (C) is preferably 3 to 100 parts by mass, more preferably 5 to 50 parts by mass, and even more preferably 5 to 30 parts by mass, with respect to 100 parts by mass of the component (A).

(Component (D): Low-Molecular Weight Compound Having Phenolic Hydroxyl Group)

The photosensitive resin composition according to the embodiments can include a low-molecular weight compound having a phenolic hydroxyl group. The low-molecular weight compound having a phenolic hydroxyl group is used in order to increase the dissolution rate of the exposed part at the time of developing with an alkali aqueous solution and enhance the sensitivity. When the photosensitive resin composition contains the component (D), the component (D) reacts with the component (A) when the resin film after pattern formation is cured by heating, and a bridged structure is formed. As a result, brittleness and melting of the cured film can be prevented.

The molecular weight of the component (D) is preferably 2000 or less, and in consideration of the solubility in an alkali aqueous solution and of the balance between the photosensitive characteristics and the physical properties of the cured film, the molecular weight as the number weight average molecular weight (Mn) is preferably 94 to 2000, more preferably 108 to 2000, and even more preferably 108 to 1500.

Regarding the low-molecular weight compound having a phenolic hydroxyl group, conventionally known compounds can be used; however, a compound represented by the following General Formula (2) is particularly preferred because the balance between the effect of promoting dissolution of the exposed part and the effect of preventing melting of the resin film during curing is excellent.

[Chemical Formula 2]

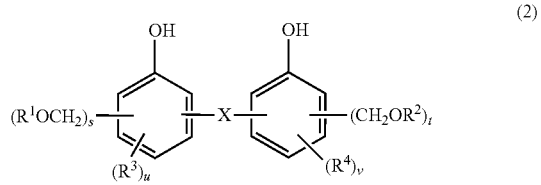

(2)

In Formula (2), X represents a single bond or a divalent organic group; $R^1$, $R^2$, $R^3$, and $R^4$ each independently represent a hydrogen atom or a monovalent organic group; s and t each independently represent an integer of 1 to 3; and u and v each independently represent an integer of 0 to 4.

A compound in which X in Formula (2) is a single bond is a biphenol (dihydroxybiphenyl) derivative. Examples of the divalent organic group represented by X include an alkylene group having 1 to 10 carbon atoms, such as a methylene group, an ethylene group, or a propylene group; an alkylidene group having 2 to 10 carbon atoms, such as an ethylidene group; an arylene group having 6 to 30 carbon atoms such as a phenylene group; a group obtained by substituting some or all of hydrogen atoms of any one of these hydrocarbon groups with halogen atoms such as fluorine atoms; a sulfone group, a carbonyl group, an ether bond, a thioether bond, and an amide bond. Among these, a divalent organic group represented by the following General Formula (3) is preferred.

[Chemical Formula 3]

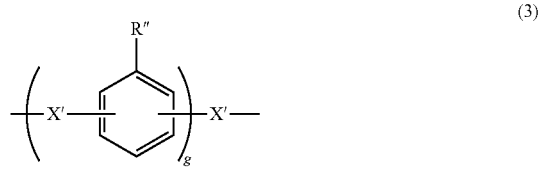

(3)

In Formula (3), X' represents a single bond, an alkylene group (for example, an alkylene group having 1 to 10 carbon atoms), an alkylidene group (for example, an alkylidene group having 2 to 10 carbon atoms), a group obtained by substituting some or all of hydrogen atoms of any one of those groups with halogen atoms, a sulfone group, a carbonyl group, an oxy group, a thio group, or an amide group; R" represents a hydrogen atom, a hydroxy group, an alkyl group, or a haloalkyl group; g represents an integer of 1 to 10; and a plurality of R"s may be identical with or different from each other.

From the viewpoints of the developing time, the allowance range of the residual film ratio at the unexposed part, and the characteristics of the cured film, the blending amount of the low-molecular weight compound having a phenolic hydroxyl group is preferably 1 to 50 parts by mass, more preferably 2 to 30 parts by mass, and even more preferably 3 to 25 parts by mass, with respect to 100 parts by mass of the component (A).

Other Components

The photosensitive resin composition according to the embodiments may further contain components such as a compound that produces acid by heating, an elastomer, a dissolution promoter, a dissolution inhibitor, a coupling agent, a solvent, a surfactant, and a leveling agent, in addition to the above-described ones.

(Compound that Generates Acid by Heating)

The photosensitive resin composition according to the embodiments can include a compound that produces acid by heating. By using a compound that produces acid by heating, it is possible to generate acid when a patterned resin film is heated, the reaction between the component (A), the component (B), and the component (D), that is, a thermal crosslinking reaction is promoted, and the heat resistance of the patterned cured film is enhanced. Furthermore, since the compound that produces acid by heating generates acid even when irradiated with light, the solubility of the exposed part in an alkali aqueous solution is increased. Therefore, the difference in the solubility in an alkali aqueous solution between an unexposed part and an exposed part becomes even larger, and the resolution is further enhanced.

It is preferable that the compound that produces acid by heating produces acid by, for example, heating up to 50° C. to 250° C. Examples of the compound that produces acid by heating include a salt formed from a strong acid and a base, such as an onium salt; and imide-sulfonate.

Examples of the onium salt include aryldiazonium salts, diaryliodonium salts such as a diphenyliodonium salt; di(alkylaryl)iodonium salts such as a diaryliodonium salt or a di(t-butylphenyl)iodonium salt; trialkylsulfonium salts such as a trimethylsulfonium salt; dialkylmonoarylsulfonium salts such as a dimethylphenylsulfonium salt; diarylmonoalkyliodonium salts such as a diphenylmethylsulfonium salt; and triarylsulfonium salts. Among these, di(t-butylphenyl) iodonium salt of para-toluenesulfonic acid, di(t-butylphenyl)iodonium salt of trifluoromethanesulfonic acid, trimethylsulfonium salt of trifluoromethanesulfonic acid, dimethylphenylsulfonium salt of trifluoromethanesulfonic acid, diphenylmethylsulfonium salt of trifluoromethanesulfonic acid, di(t-butylphenyl)iodonium salt of nonafluorobutanesulfonic acid, diphenyliodonium salt of camphorsulfonic acid, diphenyliodonium salt of ethanesulfonic acid, dimethylphenylsulfonium salt of benzenesulfonic acid, and diphenylmethylsulfonium salt of toluenesulfonic acid are preferred.

Regarding the salt formed from a strong acid and a base, in addition to the above-mentioned onium salts, a salt formed from a strong acid and a base such as follows, for example, a pyridinium salt, can be used. Examples of the strong acid include arylsulfonic acids such as p-toluenesulfonic acid and benzenesulfonic acid; perfluoroalkylsulfonic acids such as camphorsulfonic acid, trifluoromethanesulfonic acid, and nonafluorobutanesulfonic acid; and alkylsulfonic acids such as methanesulfonic acid, ethanesulfonic acid, and butanesulfonic acid. Examples of the base include alkylpyridines such as pyridine and 2,4,6-trimethylpyridine; N-alkylpyridines such as 2-chloro-N-methylpyridine; and halogenated-N-alkylpyridines.

Examples of the imide-sulfonate include naphthoylimide-sulfonate and phthalimide-sulfonate.

As the compound that produces acid by heating, in addition to the above-mentioned ones, a compound having a structure represented by the following General Formula (4) or a compound having a sulfonamide structure represented by the following General Formula (5) can also be used.

$$R^5R^6C=N-O-SO_2-R^7 \quad (4)$$

$$-NH-SO_2-R^8 \quad (5)$$

In Formula (4), $R^5$ is, for example, a cyano group; $R^6$ is, for example, a methoxyphenyl group, a phenyl group, or the like; and $R^7$ is, for example, an aryl group such as a p-methylphenyl group or a phenyl group; an alkyl group such as a methyl group, an ethyl group, or an isopropyl group; or a perfluoroalkyl group such as a trifluoromethyl group or a nonafluorobutyl group.

In Formula (5), $R^8$ is, for example, an alkyl group such as a methyl group, an ethyl group, or a propyl group; an aryl group such as a methylphenyl group or a phenyl group; or a perfluoroalkyl group such as a trifluoromethyl group or a nonafluorobutyl group. Examples of the group that is bonded to the N atom of a sulfonamide structure represented by General Formula (5) include 2,2'-bis(4-hydroxyphenyl) hexafluoropropane, 2,2'-bis(4-hydroxyphenyl)propane, and di(4-hydroxyphenyl) ether.

The blending amount in the case of using the compound that produces acid by heating may be 0.1 to 30 parts by mass, 0.2 to 20 parts by mass, or 0.5 to 10 parts by mass, with respect to 100 parts by mass of the component (A).

(Elastomer)

The photosensitive resin composition according to the embodiments may contain an elastomer component, in addition to the above-described components. An elastomer is used in order to impart flexibility to a cured product of the photosensitive resin composition. Regarding the elastomer, conventionally known compounds can be used; however, an elastomer in which the Tg of the polymer that constitutes the elastomer is 20° C. or lower is preferred.

Examples of the elastomer include a styrene-based elastomer, an olefin-based elastomer, a urethane-based elastomer, a polyester-based elastomer, a polyamide-based elastomer, an acrylic elastomer, and a silicone-based elastomer. These can be used singly or in combination of two or more kinds thereof.

The blending amount in the case of using the elastomer may be 1 to 50 parts by mass or 5 to 30 parts by mass, with respect to 100 parts by mass of the component (A). When the blending amount of the elastomer is 1 part by mass or more, the thermal shock resistance of the cured film tends to be enhanced, and when the blending amount is 50 parts by mass or less, there is a tendency that the resolution and the heat resistance of the obtained cured film are less likely to be deteriorated, and the compatibility with other components and the dispersibility are less likely to be deteriorated.

(Dissolution Promoter)

By blending a dissolution promoter into the photosensitive resin composition, the dissolution rate of the exposed part at the time of developing with an alkali aqueous solution can be increased, and the sensitivity and resolution can be enhanced. Regarding the dissolution promoter, conventionally known compounds can be used. Examples of the dissolution promoter include compounds having a carboxy group, a sulfonic acid, or a sulfonamide group. The blending amount in the case of using the dissolution promoter can be determined depending on the dissolution rate in the alkali aqueous solution, and for example, the blending amount can be set to 0.01 to 30 parts by mass with respect to 100 parts by mass of the component (A).

(Dissolution Inhibitor)

A dissolution inhibitor is a compound that inhibits solubility of the component (A) in an alkali aqueous solution and is used in order to control the residual film thickness, the developing time, and the contrast. Examples of the dissolution inhibitor include diphenyliodonium nitrate, bis(p-tert-butylphenyl)iodonium nitrate, diphenyliodonium bromide, diphenyliodonium chloride, and diphenyliodonium iodide. The blending amount in the case of using the dissolution inhibitor may be 0.01 to 20 parts by mass, 0.01 to 15 parts by mass, or 0.05 to 10 parts by mass, with respect to 100 parts by mass of the component (A), from the viewpoints of sensitivity and the allowance range of the developing time.

(Coupling Agent)

By blending a coupling agent into the photosensitive resin composition, the adhesiveness of the patterned cured film to be formed to the substrate can be increased. Examples of the coupling agent include an organosilane compound and an aluminum chelate compound.

Examples of the organosilane compound include vinyltriethoxysilane, γ-glycidoxypropyltriethoxysilane, γ-methacryloxypropyltrimethoxysilane, urea propyltriethoxysilane, methylphenylsilanediol, ethylphenylsilanediol, n-propylphenylsilanediol, isopropylphenylsilanediol, n-butylphenylsilanediol, isobutylphenylsilanediol, tert-butylphenylsilanediol, diphenylsilanediol, ethylmethylphenylsilanol, n-propylmethylphenylsilanol, isopropylmethylphenylsilanol, n-butylmethylphenylsilanol, isobutylmethylphenylsilanol, tert-butylmethylphenylsilanol, ethyl-n-propylphenylsilanol, ethylisopropylphenylsilanol, n-butylethylphenylsilanol, isobutylethylphenylsilanol, tert-butylethylphenylsilanol, methyldiphenylsilanol, ethyldiphenylsilanol, n-propyldiphenylsilanol, isopropyldiphenylsilanol, n-butyldiphenylsilanol, isobutyldiphenylsilanol, tert-butyldiphenylsilanol, phenylsilanetriol, 1,4-bis(trihydroxysilyl)benzene, 1,4-bis(methyldihydroxysilyl)benzene, 1,4-bis(ethyldihydroxysilyl)benzene, 1,4-bis(propyldihydroxysilyl)benzene, 1,4-bis(butyldihydroxysilyl)benzene, 1,4-bis(dimethylhydroxysilyl)benzene, 1,4-bis(diethylhydroxysilyl)benzene, 1,4-bis(dipropylhydroxysilyl)benzene, and 1,4-bis(dibutylhydroxysilyl)benzene.

The blending amount in the case of using the coupling agent may be 0.1 to 20 parts by mass or 0.5 to 10 parts by mass, with respect to 100 parts by mass of the component (A).

(Surfactant or Leveling Agent)

By blending a surfactant or a leveling agent into the photosensitive resin composition, coatability can be further enhanced. Specifically, for example, when the photosensitive resin composition contains a surfactant or a leveling agent, striation (unevenness of the film thickness) can be further prevented, or developability can be further enhanced. Examples of the surfactant or the leveling agent include polyoxyethylene lauryl ether, polyoxyethylene stearyl ether, polyoxyethylene oleyl ether, and polyoxyethylene octyl phenol ether. Examples of commercial products of the surfactant or the leveling agent include MEGAFACE F171, F173, and R-08 (manufactured by DIC Corporation, trade names), FLUORAD FC430 and FC431 (manufactured by Sumitomo 3M Ltd., trade names), and organosiloxane polymers KP341, KBM303, KBM403, and KBM803 (manufactured by Shin-Etsu Chemical Co., Ltd., trade names).

The blending amount in the case of using the surfactant or the leveling agent may be 0.001 to 5 parts by mass or 0.01 to 3 parts by mass, with respect to 100 parts by mass of the component (A).

(Solvent)

The photosensitive resin composition provides an effect that application on the substrate is made easy and a coating film having a uniform thickness can be formed, by containing a solvent in order to dissolve or disperse each of the components.

Examples of the solvent include γ-butyrolactone, ethyl lactate, propylene glycol monomethyl ether acetate, benzyl acetate, n-butyl acetate, ethoxyethyl propionate, 3-methyl methoxypropionate, N-methyl-2-pyrrolidone, N,N-dimethylformamide, N,N-dimethylacetamide, dimethyl sulfoxide, hexamethylphosphorylamide, tetramethylenesulfone, diethyl ketone, diisobutyl ketone, methyl amyl ketone, cyclohexanone, propylene glycol monomethyl ether, propylene glycol monopropyl ether, propylene glycol monobutyl ether, and dipropylene glycol monomethyl ether. The solvents can be used singly or in combination of two or more kinds thereof.

The blending amount of the solvent is not particularly limited; however, it is preferable to adjust the blending amount such that the proportion of the solvent in the photosensitive resin composition is 20% to 90% by mass.

The photosensitive resin composition according to the present embodiment can be developed by using an alkali aqueous solution of sodium hydroxide, potassium hydroxide, sodium silicate, ammonia, ethylamine, diethylamine, triethylamine, triethanolamine, tetramethylammonium hydroxide (TMAH), or the like. By using the photosensitive resin composition according to the present embodiment, it is possible to form a resist pattern having a satisfactory shape and having satisfactory adhesiveness and heat resistance, with sufficiently high sensitivity and resolution.

[Method for Producing Patterned Cured Film]

The method for producing a patterned cured film (resist pattern) according to the present embodiment includes a step of applying and drying the above-mentioned photosensitive resin composition on a portion or the entire surface of a substrate and forming a resin film (application and drying (film-forming) step); a step of exposing at least a portion of the resin film (exposure step); a step of developing the resin film after exposure to form a patterned resin film (development step); and a step of heating the patterned resin film (photosensitive resin film) that has been patterned (heat treatment step). Hereinafter, each step will be described.

(Application and Drying (Film-Forming) Step)

First, the photosensitive resin composition according to the present embodiment is applied and dried on a substrate to form a resin film. In this step, the photosensitive resin composition is spin-coated on a substrate such as a glass substrate, a semiconductor, a metal oxide insulator (for example, $TiO_2$ or $SiO_2$), or silicon nitride by using a spinner or the like, and a coating film is formed. The substrate on which this coating film is formed is dried using a hot plate, an oven, or the like. The drying temperature and the drying time are not particularly limited but may be 80° C. to 140° C. for 1 to 7 minutes. As a result, a photosensitive resin film is formed on the substrate.

(Exposure Step)

Next, in the exposure step, the resin film formed on the substrate is irradiated with active light rays such as ultraviolet rays, visible light, or radiation through a mask. With regard to the above-mentioned photosensitive resin composition, since the component (A) has high transparency to i-line, irradiation with i-line can be suitably used. Incidentally, after exposure, post-exposure baking (PEB) can be carried out as necessary. The temperature for the post-exposure baking is preferably 70° C. to 140° C., and the time for the post-exposure baking is preferably 1 to 5 minutes.

(Development Step)

In the development step, the resin film is patternized by removing the exposed part of the resin film after the exposure step with a liquid developer, and a patterned resin film is obtained. As the liquid developer, for example, an alkali aqueous solution of sodium hydroxide, potassium hydroxide, sodium silicate, ammonia, ethylamine, diethylamine, triethylamine, triethanolamine, tetramethylammonium hydroxide (TMAH), or the like is suitably used. The base concentration of the aqueous solutions of these may be 0.1% to 10% by mass. The liquid developer can also be used after an alcohol or a surfactant is added thereto. These may be each blended in an amount in the range of 0.01 to 10 parts by mass or 0.1 to 5 parts by mass with respect to 100 parts by mass of the liquid developer. When development is performed by using a liquid developer, the liquid developer is disposed on the resin film by means of methods such as, for example, shower development, spray development, immersion development, and paddle development, and the resin film is left to stand for 30 to 360 seconds under the conditions of 18° C. to 40° C. After being left to stand, the resin film is washed with water and subjected to spin drying to clean the patterned resin film.

(Heat Treatment Step)

Next, in the heat treatment step, a patterned cured film (resist pattern) can be formed by heat-treating the patterned resin film. The heating temperature in the heat treatment step is 250° C. or lower or 225° C. or lower, or may be 140° C. to 200° C., from the viewpoint of sufficiently preventing heat-induced damage to an electronic device.

The heat treatment can be carried using, for example, an oven such as a quartz tube furnace, a hot plate, rapid thermal annealing, a vertical diffusion furnace, an infrared curing furnace, an electron beam curing furnace, or a microwave curing furnace. Furthermore, either an air atmosphere or an inert atmosphere such as nitrogen can be selected; however, a nitrogen atmosphere is desirable because oxidation of the pattern can be prevented. Since the above-mentioned heating temperature range is lower than conventional heating temperatures, the damage to substrates and electronic devices can be suppressed to a low level. Therefore, by using the method for producing a patterned cured film according to the present embodiment, an electronic device can be produced with a high product yield. Furthermore, this leads to energy saving in the process. In addition, according to the photosensitive resin composition according to the present embodiment, since the volumetric shrinkage (curing shrinkage) in the heat treatment step exhibited by a photosensitive polyimide or the like is small, a decrease in the dimensional accuracy can be prevented.

The heat treatment time in the heat treatment step may be any time sufficient for the photosensitive resin composition to cure; however, from the viewpoint of the balance with work efficiency, the heat treatment time is preferably 5 hours or less in general.

The heat treatment can also be performed by using a microwave curing apparatus or a frequency-variable microwave curing apparatus, in addition to the above-mentioned ovens. By using these apparatuses, it is possible to effectively heat the resin film only while maintaining the temperature of the substrate and the electronic device at a desirable temperature (for example, 200° C. or lower).

In a frequency-variable microwave curing apparatus, since microwaves are irradiated in a pulsatile form while changing the frequency, standing waves can be prevented, and the substrate surface can be heated uniformly. Furthermore, in a case where the substrate includes a metal wiring as in the case of the electronic component that will be described below, when microwaves are irradiated in a pulsatile form while changing the frequency, the generation of discharge from the metal can be prevented, and electronic components can be protected from fracture. In addition, when heating is performed using frequency-variable microwaves, even when the curing temperature is lowered, the physical properties of the cured film are less likely to be deteriorated as compared with the case of using an oven (see J. Photopolym. Sci. Technol., 18, 327-332 (2005)).

The frequency of the frequency-variable microwaves is in the range of 0.5 to 20 GHz; however, practically, the frequency may be in the range of 1 to 10 GHz or in the range of 2 to 9 GHz. Furthermore, although it is desirable to continuously change the frequency of the microwaves to be irradiated, in reality, the microwaves are irradiated while changing the frequency stepwise. At that time, when the time for irradiating microwaves having a single frequency is as short as possible, standing waves, discharge from metal, and the like are less likely to occur, and therefore, the irradiation time for microwaves is preferably 1 millisecond or less, and more preferably 100 microseconds or less.

The power output of the microwaves to be irradiated varies depending on the size of the apparatus or the amount of the object to be heated; however, the output is generally in the range of 10 to 2000 W and may be practically 100 to 1000 W, 100 to 700 W, or 100 to 500 W When the output is 10 W or greater, it is easy to heat the object to be heated in a short time period, and when the output is 2000 W or less, a rapid temperature increase is not likely to occur.

It is preferable that the microwaves are irradiated by turning on and off in a pulsatile form. By irradiating the microwaves in a pulsatile form, the set heating temperature can be maintained, and it is preferable from the viewpoint that damage to the cured film and the base material can be avoided. The time for irradiating microwaves in a pulsatile form in one time varies depending on the conditions; however, the time is preferably 10 seconds or less in general.

According to the method for producing a patterned cured film as described above, a patterned cured film having satisfactory heat resistance with sufficiently high sensitivity and resolution is obtained. The patterned cured film according to the present embodiment can be used as an interlayer insulating layer or a surface protective layer for a semiconductor element.

[Production Process for Semiconductor Device]

As an example of the method for producing a patterned cured film (resist pattern) according to the present embodiment, a production process for a semiconductor device will be described on the basis of the drawings. FIG. 1 to FIG. 5 are schematic cross-sectional views illustrating an embodiment of the production process for a semiconductor device having a multilayer wiring structure.

First, a structure 100 shown in FIG. 1 is prepared. The structure 100 includes a semiconductor substrate 1 such as an Si substrate having a circuit element; a protective film 2 such as a silicon oxide film having a predetermined pattern through which the circuit element is exposed, and covering the semiconductor substrate 1; a first conductor layer 3 formed on the exposed circuit element; and an interlayer insulating layer 4 formed from a polyimide resin or the like on the protective film 2 and the first conductor layer 3 by a spin coating method or the like.

Figure 2:
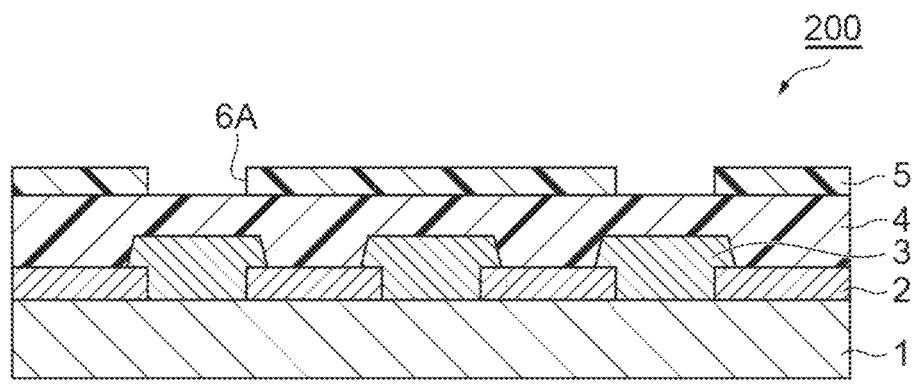
FIG. 2 is a schematic cross-sectional view explaining an embodiment of a production process for a semiconductor device.

Next, a structure 200 shown in FIG. 2 is obtained by forming a photosensitive resin layer 5 having a window part 6A on the interlayer insulating layer 4. The photosensitive resin layer 5 is formed by applying, for example, a photosensitive resin such as a chlorinated rubber-based resin, a phenol novolac-based resin, a polyhydroxystyrene-based resin, or a polyacrylic acid ester-based resin by a spin coating method. The window part 6A is formed by a known photoetching technology such that a predetermined portion of the interlayer insulating layer 4 is exposed.

Figure 3:
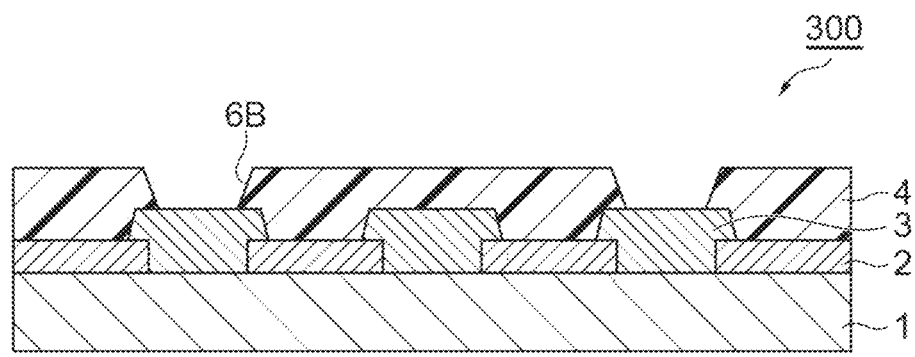
FIG. 3 is a schematic cross-sectional view explaining an embodiment of a production process for a semiconductor device.

After the window part 6B is formed by etching the interlayer insulating layer 4, the photosensitive resin layer 5 is removed, and a structure 300 represented by FIG. 3 is obtained. For the etching of the interlayer insulating layer 4, a dry etching means that uses a gas such oxygen or carbon tetrafluoride can be used. As a result of this etching, the interlayer insulating layer 4 at the portion corresponding to the window part 6A is selectively removed, and an interlayer insulating layer 4 provided with a window part 6B such that the first conductor layer 3 is exposed is obtained. Next, the photosensitive resin layer 5 is removed by using an etching solution that corrodes only the photosensitive resin layer 5 without corroding the first conductor layer 3 exposed through the window part 6B.

Figure 4:
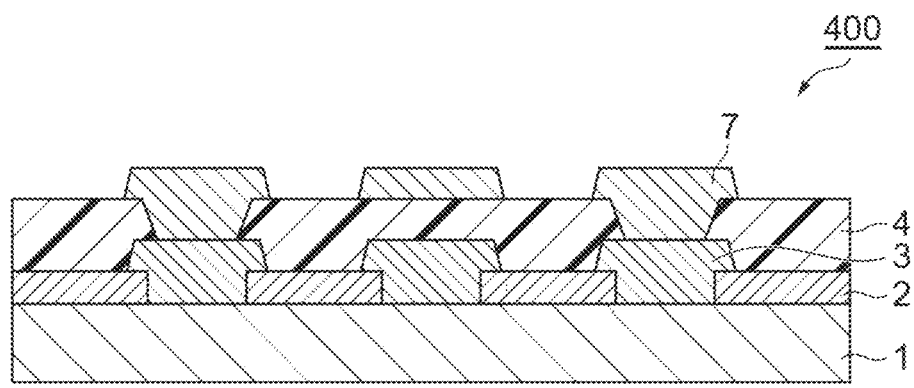
FIG. 4 is a schematic cross-sectional view explaining an embodiment of a production process for a semiconductor device.

Furthermore, a second conductor layer 7 is formed at the proportion corresponding to the window part 6B, and a structure 400 shown in FIG. 4 is obtained. For the formation of the second conductor layer 7, known photoetching technologies can be used. As a result, the second conductor layer 7 and the first conductor layer 3 are electrically connected.

Figure 5:
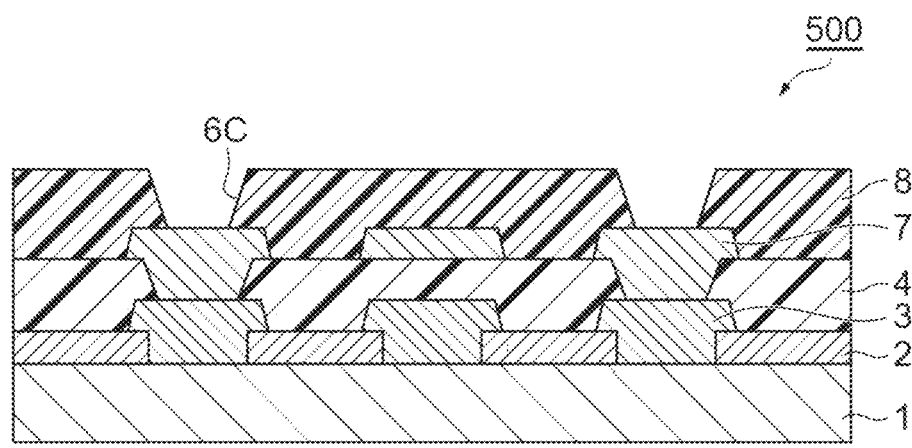
FIG. 5 is a schematic cross-sectional view explaining an embodiment of a production process for a semiconductor device.

Finally, a surface protective layer 8 is formed on the interlayer insulating layer 4 and the second conductor layer 7, and a semiconductor device 500 shown in FIG. 5 is obtained. In the present embodiment, the surface protective layer 8 is formed as follows. First, the photosensitive resin composition according to the above-mentioned embodiments is applied on the interlayer insulating layer 4 and the second conductor layer 7 by a spin coating method and dried to form a resin film. Next, a predetermined portion is irradiated with light through a mask on which a pattern corresponding to a window part 6C is drawn, and then the resin film is developed with an alkali aqueous solution to patternize the resin film. Subsequently, the resin film is cured by heating to form a film as the surface protective layer 8. This surface protective layer 8 protects the first conductor layer 3 and the second conductor layer 7 from stress from the outside, α-radiation, and the like, and the obtained semiconductor device 500 has excellent reliability.

Incidentally, the above-mentioned embodiments describe a method for producing a semiconductor device having a two-layered wiring structure; however, in the case of forming a multilayer wiring structure of three or more layers, each layer can be formed by repeatedly performing the above-mentioned steps. That is, it is possible to form a multilayer pattern by repeating each step for forming the interlayer insulating layer 4 and each step of forming the surface protective layer 8. Furthermore, in the above-described example, it is possible to form not only the surface protective layer 8 but also the interlayer insulating layer 4 by using the photosensitive resin composition according to the present embodiment.

[Electronic Component]

Next, an electronic component according to the present embodiment will be described. The electronic component according to the present embodiment has a patterned cured film formed by the above-mentioned production method as an interlayer insulating layer or a surface protective layer. The electronic component includes a semiconductor device, a multilayer wiring board, various electronic devices, and the like. The patterned cured film can be used specifically as a surface protective layer or an interlayer insulating layer for a semiconductor device, an interlayer insulating layer for a multilayer wiring board, or the like. The electronic component according to the present embodiment is not particularly limited except for having a surface protective layer or an interlayer insulating layer film formed by using the above-mentioned photosensitive resin composition, and various structures can be adopted.

Figure 6:
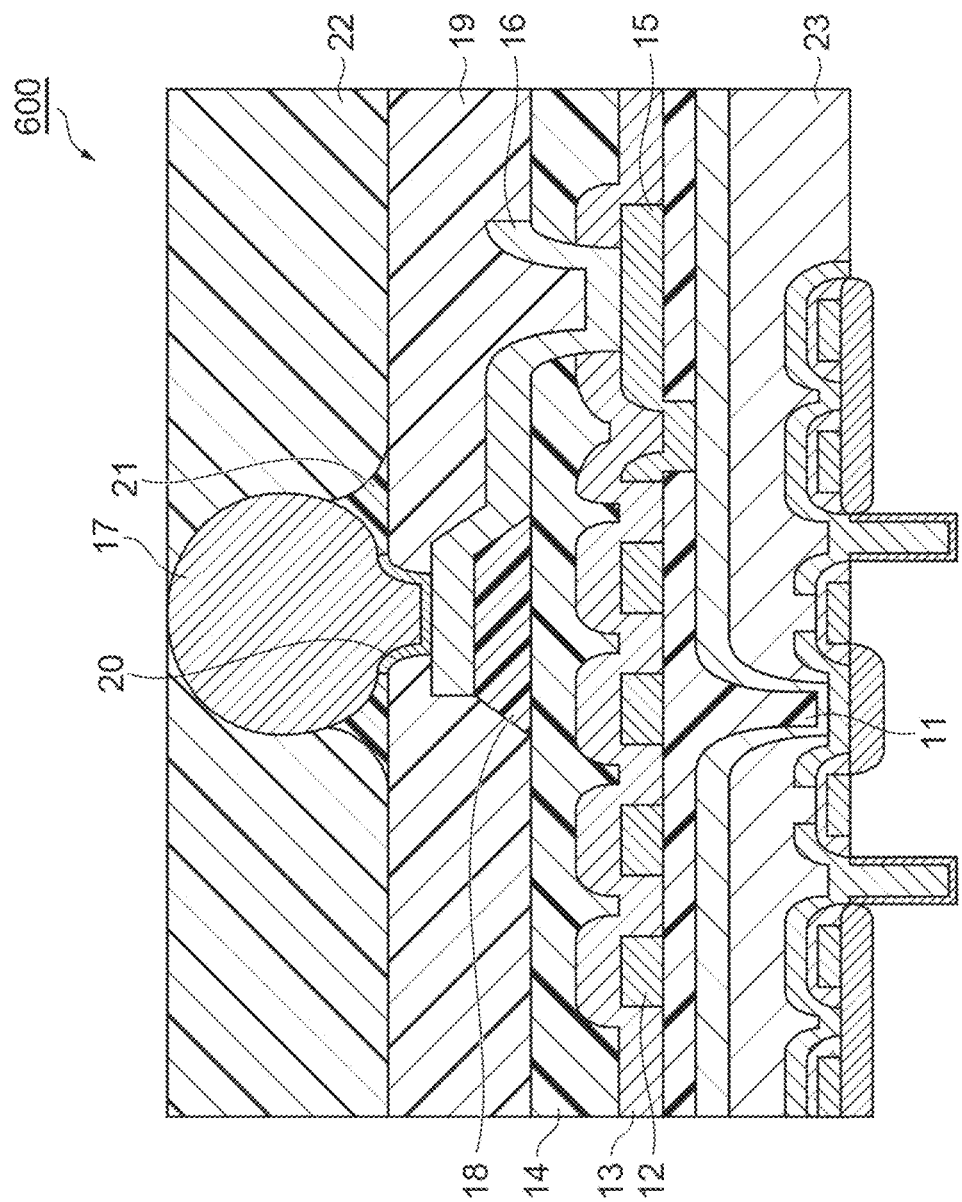
FIG. 6 is a schematic cross-sectional view illustrating an embodiment of an electronic component (semiconductor device).
Figure 7:
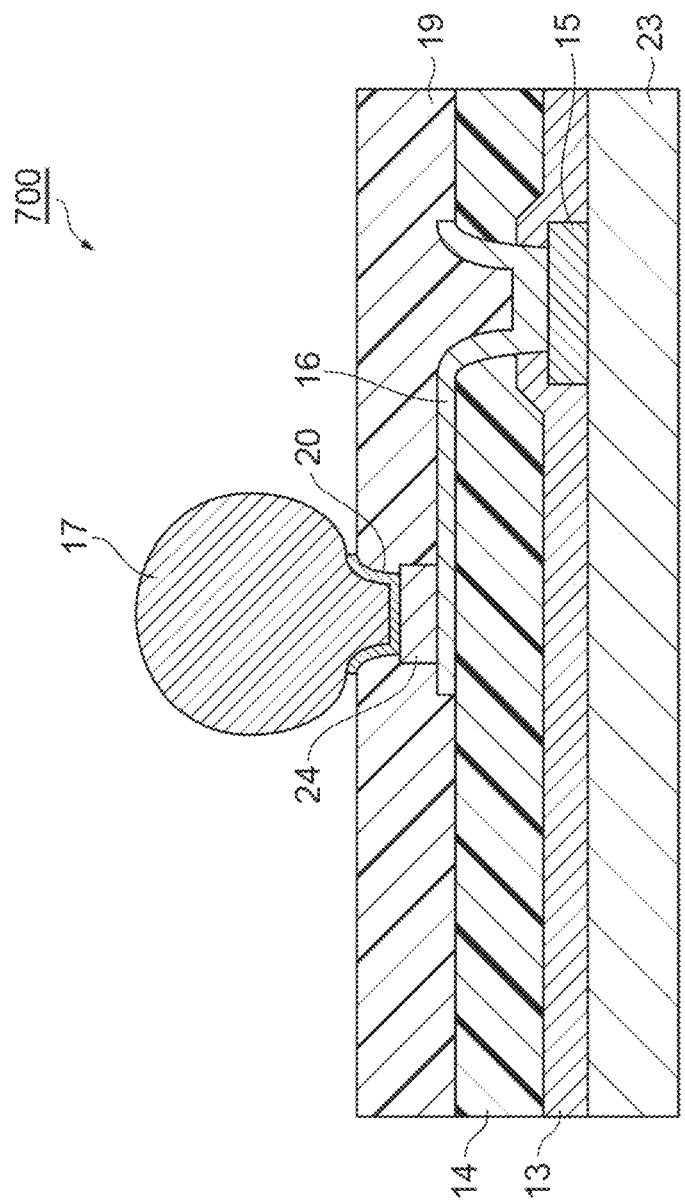
FIG. 7 is a schematic cross-sectional view illustrating an embodiment of an electronic component (semiconductor device).

Furthermore, since the above-mentioned photosensitive resin composition also has excellent stress relaxation properties, adhesiveness, and the like, the photosensitive resin composition can also be used as various structural materials in the packages having various structures developed in recent years. FIG. 6 and FIG. 7 show cross-sectional structures of an example of such a semiconductor device.

FIG. 6 is a schematic cross-sectional view showing a wiring structure as an embodiment of the semiconductor device. The semiconductor device 600 shown in FIG. 6 includes a silicon chip 23; an interlayer insulating layer 11 provided on one surface side of the silicon chip 23; an Al wiring layer 12 formed on the interlayer insulating layer 11 and having a pattern including a pad part 15; an insulating layer 13 (for example, a P—SiN layer) and a surface protective layer 14 sequentially laminated on the interlayer insulating layer 11 and the Al wiring layer 12 while forming an opening on the pad part 15; an islet-shaped core 18 disposed in the vicinity of the opening on the surface protective layer 14; and a rewiring layer 16 extending on the surface protective layer 14 so as to be in contact with the pad part 15 within the opening of the insulating layer 13 and the surface protective layer 14 and to be in contact with a surface of the core 18 on the opposite side of the surface protective layer 14. Furthermore, the semiconductor device 600 includes a cover coat layer 19 formed by covering the surface protective layer 14, the core 18, and the rewiring layer 16 and having an opening formed in a portion of the rewiring layer 16 on the core 18; a conductive ball 17 connected to the rewiring layer 16, with a barrier metal 20 interposed therebetween, in the opening of the cover coat layer 19; a collar 21 holding the conductive ball; and an underfill 22 provided on the cover coat layer 19 around the conductive ball 17. The conductive ball 17 is used as an external connection terminal and is formed from solder, gold, or the like. The underfill 22 is provided in order to relieve stress when the semiconductor device 600 is packaged.

FIG. 7 is a schematic cross-sectional view showing a wiring structure as an embodiment of the semiconductor device. In the semiconductor device 700 of FIG. 7, an Al wiring layer (not shown in the diagram) and a pad part 15 of the Al wiring layer are formed on the silicon chip 23, an insulating layer 13 is formed in the upper part thereof, and a surface protective layer 14 of the element is further formed. On the pad part 15, the rewiring layer 16 is formed, and this rewiring layer 16 extends to the upper part of the connection part 24 with the conductive ball 17, and on the surface protective layer 14, the cover coat layer 19 is formed. The rewiring layer 16 is connected to the conductive ball 17 with a barrier metal 20 interposed therebetween.

With regard to the semiconductor devices of FIG. 6 and FIG. 7, the above-mentioned photosensitive resin composition can be used as a material for forming not only as the interlayer insulating layer 11 and a surface protective layer 14 but also as the cover coat layer 19, core 18, collar 21, underfill 22, and the like. Since a cured product obtained using the above-mentioned photosensitive resin composition has excellent adhesiveness to metal layers such as an Al wiring layer 12 and a rewiring layer 16, an encapsulant material, and the like and also has a high stress relaxation effect, a semiconductor device that uses this cured product for the cover coat layer 19, the core 18, the collar 21 such as solder, and the underfill 22 used in a flip chip or the like, has highly excellent reliability.

The photosensitive resin composition according to the present embodiment is particularly suitable to be used for the surface protective layer 14 and/or the cover coat layer 19 of the semiconductor devices having a rewiring layer 16 shown in FIG. 6 and FIG. 7. The film thickness of the surface protective layer or the cover coat layer may be, for example, 3 to 20 μm or 5 to 15 μm.

By using the photosensitive resin composition according to the present embodiment, it is possible to achieve curing by using low-temperature heating at 200° C. or lower in the above-described heat treatment step that conventionally requires 300° C. or higher. Furthermore, in the photosensitive resin composition according to the present embodiment, since the volumetric shrinkage (curing shrinkage) in the heat treatment step as exhibited by a photosensitive polyimide or the like is small, a decrease in the dimensional accuracy can be prevented. The patterned cured film formed from the photosensitive resin composition according to the present embodiment has a high glass transition temperature, a surface protective layer having excellent heat resistance is formed. As a result, an electronic component such as a semiconductor device having excellent reliability can be obtained with a high product yield and a high yield.

EXAMPLES

Hereinafter, the present invention will be described more specifically by way of Examples. However, the present invention is not intended to be limited to the following Examples.

The materials used to prepare the photosensitive resin compositions of Examples and Comparative Examples will be described below.

(Component (A): Alkali-Soluble Resin)

P-1 to P-9 were prepared as the component (A). The Mw and Tg of P-1 to P-9 are summarized in Table 1.

(P-1) Cresol novolac resin (m-cresol/p-cresol (molar ratio)=60/40, Mw=12000, Tg=165° C., trade name "EP4020G", manufactured by Asahi Yukizai Corporation)

(P-2) Cresol novolac resin (m-cresol/p-cresol (molar ratio)=60/40, Mw=4500, Tg=150° C., trade name "EP4080G", manufactured by Asahi Yukizai Corporation)

(P-3)

35.6 g of 4-hydroxyphenyl methacrylate, 78.0 g of 2-hydroxyethyl methacrylate, 20.0 g of N-acryloyloxyethyl hexahydrophthalimide (trade name "M-140", manufactured by TOAGOSEI CO., LTD.), 300 g of N,N-dimethylacetamide (DMAC), and 6.43 g of azoisobutyronitrile (AIBN) were introduced into a flask, and the components were reacted at 80° C. for 6 hours in a nitrogen atmosphere. 200 g of methanol was added thereto, subsequently the mixture was slowly added dropwise to 1000 g of ion-exchanged water, and a polymer precipitated therefrom was filtered and dried to obtain P-3.

(P-4)

44.5 g of 4-hydroxyphenyl methacrylate, 39.0 g of 2-hydroxyethyl methacrylate, 45.0 g of N-acryloyloxyethyl hexahydrophthalimide, 300 g of DMAC, and 6.43 g of AIBN were introduced into a flask, and the components were reacted at 80° C. for 6 hours in a nitrogen atmosphere. 200 g of methanol was added thereto, subsequently the mixture was slowly added dropwise to 1000 g of ion-exchanged water, and a polymer precipitated therefrom was filtered and dried to obtain P-4.

(P-5)

43.0 g of methacrylic acid, 39.0 g of 2-hydroxyethyl methacrylate, 20.0 g of N-acryloyloxyethyl hexahydrophthalimide, 300 g of DMAC, and 5.10 g of AIBN were introduced into a flask, and the components were reacted at 80° C. for 6 hours in a nitrogen atmosphere. 200 g of methanol was added thereto, subsequently the mixture was slowly added dropwise to 1000 g of ion-exchanged water, and a resin precipitated therefrom was filtered and dried to obtain P-5.

(P-6)

Into a 300-mL flask equipped with a stirrer, a thermometer, a nitrogen purge apparatus (nitrogen inlet tube), and a reflux condenser with a water receiving container, 14.64 g (0.04 mol) of 2,2-bis(3-amino-4-hydroxyphenyl)hexafluoropropane (trade name "BIS-AP-AF", manufactured by Central Glass Co., Ltd.), 19.48 g (0.045 mol) of polyoxypropylenediamine (trade name "D-400", manufactured by BASF), and 2.485 g (0.01 mol) of 3,3'-(1,1,3,3-tetramethyldisiloxane-1,3-diyl) bispropylamine (trade name "BY16-871EG", manufactured by Dow Corning Toray Co., Ltd.), all of which are amine components, and 80 g of N-methyl-2-pyrrolidone (NMP) as a solvent were introduced, and the mixture was stirred to dissolve the amine components in the solvent. While the flask was cooled in an ice bath, 31 g (0.1 mol) of 4,4'-oxydiphthalic dianhydride (ODPA) was added little by little to the solution in the flask. After completion of the addition, the solution was heated to 180° C. while blowing nitrogen gas and kept at that temperature for 5 hours to obtain an NMP solution of P-6.

(P-7)

Into a flask equipped with a stirrer, a thermometer, a nitrogen purge apparatus (nitrogen inlet tube), and a reflux condenser with a water receiving container, 7.15 g (0.025 mol) of 5,5'-methylenebis(anthranilic acid) (trade name "MBAA", manufactured by Wakayama Seika Kogyo Co., Ltd., molecular weight 286), 25.98 g (0.06 mol) of "D-400 (polyoxypropylenediamine)", and 2.48 g (0.01 mol) of "BY16-871EG (3,3'-(1,1,3,3-tetramethyldisiloxane-1,3-diyl) bispropylamine)", all of which are diamines, and 110 g of NMP as a solvent were introduced, and the mixture was stirred to dissolve the diamines in the solvent. While the flask was cooled in an ice bath, 31 g (0.1 mol) of ODPA was added little by little to the solution in the flask. After completion of the addition, the solution was heated to 180° C. while blowing nitrogen gas and kept at that temperature for 5 hours to obtain an NMP solution of P-7.

(P-8)

44.5 g of 4-hydroxyphenyl methacrylate, 39.0 g of 2-hydroxyethyl methacrylate, 45.0 g of methyl methacrylate, 300 g of DMAC, and 6.43 g of AIBN were introduced into a flask, and the mixture was reacted at 80° C. for 6 hours in a nitrogen atmosphere. 200 g of methanol was added thereto, subsequently the mixture was slowly added dropwise to 1000 g of ion-exchanged water, and a polymer precipitated therefrom was filtered and dried to obtain P-8.

(P-9)

55 g of ethyl lactate was weighed in a 100-mL three-necked flask equipped with a stirrer, a nitrogen inlet tube, and a thermometer, and separately weighed polymerizable monomers (34.7 g of n-butyl acrylate (BA), 2.2 g of lauryl acrylate (LA), 3.9 g of acrylic acid (AA), 2.6 g of hydroxybutyl acrylate (HBA), and 1.7 g of 1,2,2,6,6-pentamethylpyridin-4-yl methacrylate (trade name "FA-711MM", manufactured by Hitachi Chemical Company, Ltd.), and 0.29 g of AIBN were added. Dissolved oxygen was removed by allowing nitrogen gas to flow at a flow rate of 400 mL/min for 30 minutes while stirring the mixture at room temperature (25° C.) at a speed of stirring rotation of about 160 rpm (min$^{-1}$). Subsequently, inflow of nitrogen gas was stopped, the flask was tightly sealed, and the temperature was raised to 65° C. in about 25 minutes in a constant temperature water tank. The same temperature was maintained for 10 hours to perform a polymerization reaction, and an ethyl lactate solution of acrylic resin P-9 was obtained. The polymerization ratio at this time was 99%.

TABLE 1

| | Component (A) | Imide group | Mw | Tg (° C.) |
|---|---|---|---|---|
| P-1 | Cresol novolac resin | Absent | 12000 | 165 |
| P-2 | Cresol novolac resin | Absent | 4500 | 150 |
| P-3 | Acrylic resin having phenolic hydroxyl group | Present | 22000 | 100 |
| P-4 | Acrylic resin having phenolic hydroxyl group | Present | 22000 | 140 |
| P-5 | Acrylic resin having carboxy group | Present | 25000 | 120 |
| P-6 | Polyimide resin having hydroxyl group | Present | 42000 | 65 |
| P-7 | Polyimide resin having carboxy group | Present | 34000 | 55 |
| P-8 | Acrylic resin having phenolic hydroxyl group | Absent | 22000 | 100 |
| P-9 | Acrylic resin having carboxy group | Absent | 22000 | −20 |

(Component (B): Thermosetting Resin)
  (B-1): 4,4',4"-Ethylidenetris[2,6-(methoxymethyl)phenol] (trade name "HMOM-TPHAP", manufactured by Honshu Chemical Industry Co., Ltd.)
  (B-2): Bisphenol A bis(triethylene glycol glycidyl ether) ether (trade name "BEO-60E", manufactured by New Japan Chemical Co., Ltd.)
(Component (C): Photosensitizer)
  (C-1): 1-Naphthoquinone-2-diazide-5-sulfonic acid ester of tris(4-hydroxyphenyl)methane (esterification ratio about 95%)
(Component (D): Low-Molecular Weight Compound Having Phenolic Hydroxyl Group)

(D-1): 1,1-Bis(4-hydroxyphenyl)-1-[4-{1-(4-hydroxyphenyl)-1-methylethyl}phenyl]ethane (trade name "TrsP-PA-MF", manufactured by Honshu Chemical Industry Co., Ltd.)

The components (A) to (D) in the blending amounts (parts by mass) shown in Table 2, 120 parts by mass of ethyl lactate as a solvent, and 2 parts by mass of a 50% by mass ethanol solution of 3-glycidoxypropyltriethoxysilane (trade name "KBE-403", manufactured by Shin-Etsu Chemical Co., Ltd.) as a coupling agent were mixed. The mixture was pressure-filtered using a filter made of a polyethylene tetrafluoride resin and having a pore size of 3 μm to prepare a photosensitive resin composition.

TABLE 2

|     |         | Example |    |    |    |    |    | Comparative Example |    |    |
|-----|---------|---------|----|----|----|----|----|---------------------|----|----|
|     |         | 1       | 2  | 3  | 4  | 5  | 6  | 1                   | 2  | 3  |
| (A) | P-1     | 60      | 60 | 60 | 60 | 60 | —  | —                   | 80 | 60 |
|     | P-2     | —       | —  | —  | —  | —  | 80 | 100                 | —  | —  |
|     | P-3     | —       | —  | 40 | —  | —  | —  | —                   | —  | —  |
|     | P-4     | —       | —  | —  | 40 | —  | 20 | —                   | —  | —  |
|     | P-5     | —       | —  | —  | —  | 40 | —  | —                   | —  | —  |
|     | P-6     | 40      | —  | —  | —  | —  | —  | —                   | —  | —  |
|     | P-7     | —       | 40 | —  | —  | —  | —  | —                   | —  | —  |
|     | P-8     | —       | —  | —  | —  | —  | —  | —                   | —  | 40 |
|     | P-9     | —       | —  | —  | —  | —  | —  | —                   | 20 | —  |
| (B) | B-1     | 15      | 15 | 15 | 15 | 15 | 15 | 15                  | 15 | 15 |
|     | B-2     | 10      | 10 | 10 | 10 | 10 | 10 | 10                  | 10 | 10 |
| (C) | C-1     | 15      | 15 | 15 | 15 | 15 | 15 | 15                  | 15 | 15 |
| (D) | D-1     | 5       | 5  | 5  | 5  | 5  | 5  | 5                   | 5  | 5  |
|     | KBM-403 | 1       | 1  | 1  | 1  | 1  | 1  | 1                   | 1  | 1  |

<Evaluation of Photosensitive Resin Composition>

A photosensitive resin composition was subjected to evaluations shown below. The results are presented in Table 3.

(Production of Sample for Evaluation)

On a 6-inch silicon wafer on which copper was formed on the surface by sputtering, a photosensitive resin composition was applied by means of a spin coater such that the film thickness after curing was 10 μm, and the photosensitive resin composition was heated at 100° C. for 5 minutes on a hot plate to form a resin film. The resin film was exposed through a photomask designed to obtain a strip pattern having a width of 10 mm, by using a high-precision parallel exposure machine (trade name "EXM-1172-B-∞", manufactured by ORC MANUFACTURING Co., Ltd.) under the conditions of 1000 mJ/cm², and the reason film was developed using a 2.38% by mass aqueous solution of TMAH to obtain a strip pattern of the resin film. The strip pattern was heated under the conditions of 200° C. and 2 hours under nitrogen and then immersed in an etching solution for copper to produce a strip sample of the cured film having a film thickness of 10 μm and a width of 10 mm.

(Fatigue Fracture Resistance)

A fatigue test for the strip sample was carried out by using an Autograph (AG-1kNXplus) with a special-type constant temperature tank manufactured by SHIMADZU CORPORATION under each of the following conditions.

Condition (1): The strip sample is repeatedly pulled (0 to 100 MPa) under the conditions including a set temperature of 25° C., a distance between chucks of 20 mm, a testing rate of 5 mm/min, and a cyclic load stress of 100 MPa.

Condition (2): The strip sample is repeatedly pulled (0 to 120 MPa) under the conditions including a set temperature of −55° C., a distance between chucks of 20 mm, a testing rate of 5 mm/min, and a cyclic load stress of 120 MPa.

Measurement was carried out three times under each of the conditions, and the fatigue fracture resistance was evaluated as follows: a case in which the average number of times of pulling at which breaking of the strip sample occurred was more than 1000 cycles was rated as "A"; a case in which the average number of times was 100 to 1000 cycles was rated as "B"; and a case in which breaking occurred in fewer than 100 cycles was rated as "C".

(Elongation)

In the Examples, the strip sample that had been subjected to 100 cycles of the fatigue test under the above-described conditions was pulled using an Autograph (AG-1kNXplus) with a special-type constant temperature tank manufactured by SHIMADZU CORPORATION under the conditions including a set temperature of 25° C., a distance between chucks of 20 mm, and a testing rate of 5 mm/min, and the elongation ratio at the time of breakage was measured.

(Yield Stress)

A curve was obtained by plotting the elongation ratio on the axis of abscissa and stress on the axis of ordinate in the above-described tensile test, and the value of stress at the intersection of a tangent line of the obtained curve in the plot showing an elongation ratio of 5% and a tangent line of the curve in the plot showing an elongation ratio of 15%, was defined as the yield stress.

(Young's Modulus)

The Young's modulus was calculated from the gradient in an elongation range of 0% to 5% of a curve obtained by plotting the elongation ratio on the axis of abscissa and stress on the axis of ordinate in the above-described tensile test.

Regarding the strip samples produced in the Comparative Examples, since the strip samples broke in fewer than 100 cycles of the fatigue test, the elongation, yield stress, and Young's modulus of the Comparative Examples were measured by using strip samples that had not been subjected to the fatigue test.

(Glass Transition Temperature)

The viscoelasticity of the strip sample was measured by using a dynamic viscoelasticity measuring apparatus manufactured by UBM at a distance between chucks of 20 mm, a frequency of 10 Hz, and a temperature increase rate of 5° C./min in a temperature range of 40° C. to 260° C., and the temperature presenting the maximum value of tan δ was defined as the glass transition temperature (Tg).

(Deposit Ratio)

A photosensitive resin composition was applied on an electroplated copper substrate using a spin coater such that the film thickness after curing was 10 μm, and the applied film was heated on a hot plate at 120° C. for 3 minutes to form a resin film. Next, the resin film was cured by heating the resin film under the conditions of 200° C. and 2 hours in a nitrogen atmosphere to produce a sample for evaluating the deposit ratio.

The sample for evaluating the deposit ratio was repeatedly subjected to 200 times of a temperature cycle test of changing temperature from −65° C. to 150° C. in an air atmosphere at atmospheric pressure under the conditions of a stopping time of 15 minutes, with the initiation temperature and the completion temperature set at −65° C., and then the cured film was cut in a lattice pattern by the cross-cut method specified in JIS K 5600-5-6. Next, a tape having an adhesive force of 10±1 N per a width of 25 mm was attached to a lattice (cured film) of 25 squares, and within 5 minutes after adhesion, the tape was peeled off by pulling the tape vertically in 0.5 to 1.0 second. The number of lattices in which the cured film was peeled off along the edges of the cuts or lattices in which the cured film was peeled off at the intersection points was measured, and the proportion (deposit ratio) of the lattices (cured film) adhering to the electroplated copper substrate was calculated. The deposit ratio was evaluated as follows: a case in which the deposit ratio was 100% was rated as "A"; a case in which the deposit ratio was 75% or greater and less than 100% was rated as "B"; and a case in which the deposit ratio was less than 75% was rated as "C".

(Reliability)

A photosensitive resin composition was applied on a 8-inch silicon wafer having a thickness of 400 μm by using a spin coater such that the film thickness after curing was 10 μm, and the applied resin composition was heated on a hot plate at 100° C. for 5 minutes and then heated under the conditions of 200° C. and 2 hours under nitrogen to produce a cured film of a first layer. A seed layer was formed by using a sputtering apparatus such that 200 nm of Cu was formed on 50 nm of Ti, a resist material was subjected to pattern formation, and electroplating was performed such that the copper thickness was 5 μm. The resist material was peeled off with NMP, and Cu and Ti were removed by etching to produce a copper pattern of a first layer having a diameter of 350 μm. For the portions other than the copper pattern, a photomask designed by means of a mesh pattern of copper to have a residual copper ratio of 70% was used.

Next, the photosensitive resin composition was applied by using a spin coater such that the film thickness after curing on the copper was 5 μm, the photosensitive resin composition was heated on a hot plate at 100° C. for 5 minutes, subsequently the photosensitive resin composition was exposed at 600 mJ/cm² by means of a stepper exposure machine (Sc6k manufactured by CERMA PRECISION, INC.) through a photomask designed to form an opening having a diameter of 80 μm at the center part of the copper pattern of the first layer having a diameter of 350 μm, and then development was performed with a 2.38% by mass aqueous solution of TMAH to form an opening having a diameter of 80 μm. The assembly was heated under the conditions of 200° C. and 2 hours under nitrogen to produce a cured film of a second layer.

A seed layer was formed by using a sputtering apparatus such that 200 nm of Cu was formed on 50 nm of Ti, the resist material was subjected to pattern formation through a photomask designed to form an opening having a diameter of 240 μm at the central part of the copper pattern of the first layer having a diameter of 350 μm, and electroplating was performed such that the copper thickness was 5 μm. The resist material was peeled off with NMP, and Cu and Ti were removed by etching to produce a copper pattern of a second layer having a diameter of 240 μm. For the portions other than the copper pattern, a photomask designed such that the mesh pattern of copper had a residual copper ratio of 30% was used. A flux was applied on the copper pattern of the second layer having a diameter of 240 μm, a solder ball (manufactured by SENJU METAL INDUSTRY CO., LTD., ECO SOLDER BALL SM705) having a diameter of 250 μm was mounted, reflow soldering was performed under the profile conditions equivalent to JEDEC (Joint Electron Device Engineering Council; J-STD-020D) in a nitrogen atmosphere, and then flux cleaning was carried out to obtain a package for reliability evaluation.

A temperature cycle test of the above-described package was performed under the conditions of repeating 1000 times of the JESD 22-A104 condition B standard, which is a cycle of 15 minutes at −55° C. and 15 minutes at 125° C., and side walls of the copper pattern of the second layer having a diameter of 240 μm was observed at 300 sites. Package reliability (thermal shock reliability) was evaluated as follows: a case in which the number of sites where cracks were generated was less than 5% was rated as "A"; a case in which the number of sites was 5% to 20% was rated as "B"; and a case in which the number of sites was more than 20% was rated as "C".

TABLE 3

| | | Example | | | | | | Comparative Example | | |
|---|---|---|---|---|---|---|---|---|---|---|
| | | 1 | 2 | 3 | 4 | 5 | 6 | 1 | 2 | 3 |
| (1) | Fatigue fracture | 1000< | 1000< | 1000< | 1000< | 1000< | 280 | 7 | 53 | 70 |
| | | A | A | A | A | A | B | C | C | C |
| | Elongation (%) | 35 | 30 | 25 | 15 | 15 | 12 | 6 | 12 | 7 |
| | Yield stress (MPa) | 170 | 160 | 150 | 160 | 160 | 150 | 150 | 110 | 110 |
| | Young's modulus (GPa) | 1.5 | 1.8 | 2.3 | 2.5 | 2.4 | 2.8 | 2.3 | 2.1 | 2.1 |
| (2) | Fatigue fracture | 1000< | 1000< | 1000< | 1000< | 1000< | 280 | 7 | 53 | 70 |
| | | A | A | A | A | A | B | C | C | C |
| | Elongation (%) | 35 | 30 | 25 | 15 | 15 | 12 | 6 | 12 | 7 |
| | Yield stress (MPa) | 170 | 160 | 150 | 160 | 160 | 150 | 150 | 110 | 110 |
| | Young's modulus (GPa) | 1.5 | 1.8 | 2.3 | 2.5 | 2.4 | 2.8 | 2.3 | 2.1 | 2.1 |
| | Deposit ratio | A | A | A | A | A | B | C | C | C |
| | Tg (° C.) | 190 | 190 | 200 | 220 | 220 | 200 | 200 | 200 | 200 |
| | Reliability | A | A | A | A | A | B | C | C | C |

As shown in Table 3, the fatigue test under the conditions (1) and (2) correlates with package reliability, and it can be confirmed that by evaluating the fatigue fracture resistance of a cured film, the evaluation of thermal shock reliability (package reliability), which requires time for sample production and evaluation, can be carried out conveniently in a short period of time. When a photosensitive resin composition having a fatigue fracture resistance of 100 or more cycles, which has been selected by the fatigue test, is used, a patterned cured film having excellent thermal shock reliability (package reliability) can be formed, and a semiconductor device that uses this patterned cured film also has excellent thermal shock reliability.

REFERENCE SIGNS LIST

1: semiconductor substrate, 2: protective film, 3: first conductor layer, 4: interlayer insulating layer, 5: photosensitive resin layer, 6A, 6B, 6C: window part, 7: second conductor layer, 8: surface protective layer, 11: interlayer insulating layer, 12: Al wiring layer, 13: insulating layer, 14: surface protective layer, 15: pad part, 16: rewiring layer, 17: conductive ball, 18: core, 19: cover coat layer, 20: barrier metal, 21: collar, 22: underfill, 23: silicon chip, 24: connection part, 100, 200, 300, 400: structure, 500: semiconductor device, 600: semiconductor device, 700: semiconductor device.

The invention claimed is:

1. A method for selecting a photosensitive resin composition, the method comprising:
    exposing a resin film of a photosensitive resin composition at 100 to 2000 mJ/cm$^2$ and heat-treating the resin film at 150° C. to 250° C. for 1 to 3 hours under nitrogen to produce a strip sample of a cured film having a film thickness of 10 µm and a width of 10 mm;
    performing a fatigue test of repeatedly pulling the strip sample under the conditions including a set temperature of 25° C., a distance between chucks of 20 mm, a testing rate of 5 mm/min, and a cyclic load stress of 100 MPa; and
    selecting a photosensitive resin composition satisfying the following condition: a number of times of pulling required until the strip sample breaks in the fatigue test is 100 or more cycles.

2. The method for selecting a photosensitive resin composition according to claim 1, wherein in a tensile test of pulling the strip sample that has been subjected to 100 cycles of the fatigue test, under the conditions including a set temperature of 25° C., a distance between chucks of 20 mm, and a testing rate of 5 mm/min, a breaking elongation ratio of the strip sample is 10% to 60%.

3. The method for selecting a photosensitive resin composition according to claim 2, wherein a yield stress of the strip sample in the tensile test is 120 to 200 MPa.

4. The method for selecting a photosensitive resin composition according to claim 2, wherein a Young's modulus of the strip sample in the tensile test is 0.5 to 2.8 GPa.

5. The method for selecting a photosensitive resin composition according to claim 1, wherein a glass transition temperature of the cured film is 150° C. or higher.

6. A method for selecting a photosensitive resin composition, the method comprising:
    exposing a resin film of a photosensitive resin composition at 100 to 2000 mJ/cm$^2$ and heat-treating the resin film at 150° C. to 250° C. for 1 to 3 hours under nitrogen to produce a strip sample of a cured film having a film thickness of 10 µm and a width of 10 mm;
    performing a fatigue test of repeatedly pulling the strip sample under the conditions including a set temperature of −55° C., a distance between chucks of 20 mm, a testing rate of 5 mm/min, and a cyclic load stress of 120 MPa; and
    selecting a photosensitive resin composition satisfying the following condition: a number of times of pulling required until the strip sample breaks in the fatigue test is 100 or more cycles.

7. The method for selecting a photosensitive resin composition according to claim 6, wherein in a tensile test of pulling a strip sample that has been subjected to 100 cycles of the fatigue test, under the conditions including a set temperature of 25° C., a distance between chucks of 20 mm, and a testing rate of 5 mm/min, a breaking elongation ratio of the strip sample is 10% to 60%.

8. The method for selecting a photosensitive resin composition according to claim 7, wherein a yield stress of the strip sample in the tensile test is 120 to 200 MPa.

9. The method for selecting a photosensitive resin composition according to claim 7, wherein a Young's modulus of the strip sample in the tensile test is 0.5 to 2.8 GPa.

10. The method for selecting a photosensitive resin composition according to claim 7, wherein a glass transition temperature of the cured film is 150° C. or higher.

11. A method for producing a patterned cured film, the method comprising:
    a step of applying a photosensitive resin composition selected by the method for selecting a photosensitive resin composition according to claim 1 on a portion or the entire surface of a substrate and drying the photosensitive resin composition to form a resin film;
    a step of exposing at least a portion of the resin film;
    a step of developing the resin film after exposure to form a patterned resin film; and
    a step of heating the patterned resin film.

12. A method for producing a semiconductor device that includes a patterned cured film formed by the method for producing a patterned cured film according to claim 11 as an interlayer insulating layer or a surface protective layer.

13. A method for producing a patterned cured film, the method comprising:
    a step of applying a photosensitive resin composition selected by the method for selecting a photosensitive resin composition according to claim 6 on a portion or the entire surface of a substrate and drying the photosensitive resin composition to form a resin film;
    a step of exposing at least a portion of the resin film;
    a step of developing the resin film after exposure to form a patterned resin film; and
    a step of heating the patterned resin film.

14. A method for producing a semiconductor device that includes a patterned cured film formed by the method for producing a patterned cured film according to claim 13 as an interlayer insulating layer or a surface protective layer.

* * * * *